(12) United States Patent
Kobayashi et al.

(10) Patent No.: US 9,293,493 B2
(45) Date of Patent: Mar. 22, 2016

(54) PHOTOELECTRIC CONVERSION APPARATUS AND IMAGE SENSING SYSTEM

(75) Inventors: Masahiro Kobayashi, Tokyo (JP); Masaki Kurihara, Koza-gun (JP); Takeshi Ichikawa, Hachioji (JP); Yasuhiro Sekine, Yokohama (JP); Mahito Shinohara, Tokyo (JP); Taro Kato, Kawasaki (JP); Genzo Momma, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1011 days.

(21) Appl. No.: 13/364,230

(22) Filed: Feb. 1, 2012

(65) Prior Publication Data
US 2012/0200728 A1     Aug. 9, 2012

(30) Foreign Application Priority Data

Feb. 9, 2011  (JP) .................................. 2011-026345
Oct. 7, 2011  (JP) .................................. 2011-223303

(51) Int. Cl.
H01L 27/146     (2006.01)

(52) U.S. Cl.
CPC .... H01L 27/14629 (2013.01); H01L 27/14623 (2013.01); H01L 27/14627 (2013.01)

(58) Field of Classification Search
CPC . H04N 5/2251; H04N 5/2252; H04N 5/2253; H01L 27/14629; H01L 27/14623; H01L 27/14627
USPC ......... 348/266, 272, 273, 274, 275, 276, 277, 348/280, 290, 291, 294, 281, 282, 302, 306, 348/307, 308, 309, 310, 311, 335, 336, 337, 348/338, 339, 340; 257/288, 290, 291, 294, 257/432
See application file for complete search history.

(56) References Cited

U.S. PATENT DOCUMENTS

| 8,330,840 | B2* | 12/2012 | Lenchenkov | ..... H01L 27/14621 348/273 |
| 2003/0173599 | A1 | 9/2003 | Nakai | |
| 2004/0238908 | A1* | 12/2004 | Hashimoto | ....... H01L 27/14623 257/432 |
| 2005/0072906 | A1 | 4/2005 | Dobashi | |
| 2005/0236553 | A1* | 10/2005 | Noto | ................. H01L 27/14621 250/208.1 |
| 2006/0076636 | A1 | 4/2006 | Fukunaga | |

(Continued)

FOREIGN PATENT DOCUMENTS

| CN | 101097846 A | 1/2008 |
| CN | 101197386 A | 6/2008 |

(Continued)

Primary Examiner — Twyler Haskins
Assistant Examiner — Peter Chon
(74) Attorney, Agent, or Firm — Canon USA, Inc. IP Division

(57) ABSTRACT

A photoelectric conversion apparatus at least includes an insulating film, a plurality of high-refractive-index members provided so as to correspond respectively to individual photoelectric conversion portions, being surrounded by the insulating film and having a refractive index higher than the refractive index of the insulating film, and a high-refractive-index film provided on the insulating film so as to connect the plurality of high-refractive-index members to one another and having a refractive index higher than the refractive index of the insulating film, and lens portions lying next to each other from among a plurality of lens portions border each other.

30 Claims, 8 Drawing Sheets

(56) References Cited

U.S. PATENT DOCUMENTS

| | | | |
|---|---|---|---|
| 2008/0315339 A1* | 12/2008 | Rennie | G02B 5/201 257/432 |
| 2009/0206434 A1 | 8/2009 | Hashimoto | |
| 2010/0053390 A1* | 3/2010 | Takubo | H01L 27/14625 348/294 |
| 2010/0225791 A1 | 9/2010 | Nakayama | |
| 2010/0289939 A1 | 11/2010 | Ogino | |

FOREIGN PATENT DOCUMENTS

| | | |
|---|---|---|
| JP | 2003-224251 A | 8/2003 |
| JP | 2005-109411 A | 4/2005 |
| JP | 2006-49825 A | 2/2006 |
| JP | 2006-121065 A | 5/2006 |
| JP | 2006-185947 A | 7/2006 |
| JP | 2006-351759 A | 12/2006 |
| JP | 2007-201091 A | 8/2007 |
| JP | 2008-009079 A | 1/2008 |
| JP | 2008-52004 A | 3/2008 |
| JP | 2008-58794 A | 3/2008 |
| JP | 2008-071972 A | 3/2008 |
| JP | 2008-104079 A | 5/2008 |
| JP | 2008-192951 A | 8/2008 |
| JP | 2008-258203 A | 10/2008 |
| JP | 2009-194340 A | 8/2009 |
| JP | 2009-194402 A | 8/2009 |
| JP | 2005-252391 A | 9/2009 |
| JP | 2010-267770 A | 11/2010 |
| WO | 2009/019818 A | 2/2009 |

\* cited by examiner

PHOTOELECTRIC CONVERSION APPARATUS AND IMAGE SENSING SYSTEM

BACKGROUND OF THE INVENTION

1. Field of the Invention

The present invention relates to a photoelectric conversion apparatus provided with a semiconductor substrate having a plurality of photoelectric conversion portions and an image sensing system.

2. Description of the Related Art

In a photoelectric conversion apparatus having a plurality of photoelectric conversion portions, it is required to cause light beams to adequately enter the plurality of photoelectric conversion portions respectively. In order to do so, providing a light guide structure having lenses (microlenses) for collecting incident light beams or light guide paths (optical waveguide) for guiding incident light beams to the photoelectric conversion portion is effective. In Japanese Patent Laid-Open No. 2007-201091 and Japanese Patent Laid-Open No. 2008-192951, photoelectric conversion apparatuses having lenses and a light guide structure are disclosed.

SUMMARY OF THE INVENTION

One of the aspects of the invention provides a photoelectric conversion apparatus including: a plurality of photoelectric conversion portions; an insulating film; a plurality of high-refractive-index members provided respectively on the individual photoelectric conversion portions so as to be surrounded by the insulating film and having a refractive index greater than the refractive index of the insulating film; a high-refractive-index film provided on the insulating film to connect the plurality of the high-refractive-index members, and having a refractive index greater than the refractive index of the insulating film; a plurality of first lens portions arranged to correspond to the individual photoelectric conversion portions; and a plurality of second lens portions each arranged to correspond to the individual photoelectric conversion portions between the first lens portions and the high-refractive-index members, wherein at least one of (1) the first lens portions lying next to each other from among the plurality of first lens portions and (2) the second lens portions lying next to each other from among the plurality of second lens portions border each other.

Another aspects of the invention also provides a photoelectric conversion apparatus including: a plurality of photoelectric conversion portions; an insulating film; a plurality of high-refractive-index members provided respectively on each of the plurality of photoelectric conversion portions to be surrounded by the insulating film and having a refractive index greater than the refractive index of the insulating film; a high-refractive-index film provided on the insulating film to connect the plurality of the high-refractive-index members, and having a refractive index greater than the refractive index of the insulating film; and a plurality of collective lens portions arranged corresponding respectively to the individual photoelectric conversion portions and provided on a composite member, wherein the collective lens portions lying next to each other and arranged so that optical axes thereof are spaced apart from each other by a predetermined distance from among the plurality of collective lens portions border each other, and the collective lens portions lying next to each other and arranged so that optical axes thereof are spaced apart from each other by a distance greater than the predetermined distance from among the plurality of collective lens portions border each other.

Further features of the present invention will become apparent from the following description of exemplary embodiments with reference to the attached drawings.

DESCRIPTION OF THE EMBODIMENTS

Figure 1A:
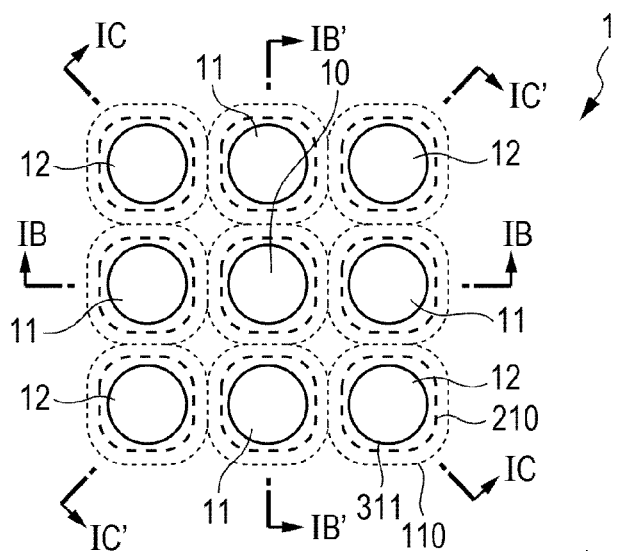
FIG. 1A is an explanatory schematic plan view of a photoelectric conversion apparatus according to a first embodiment.
Figure 1B:
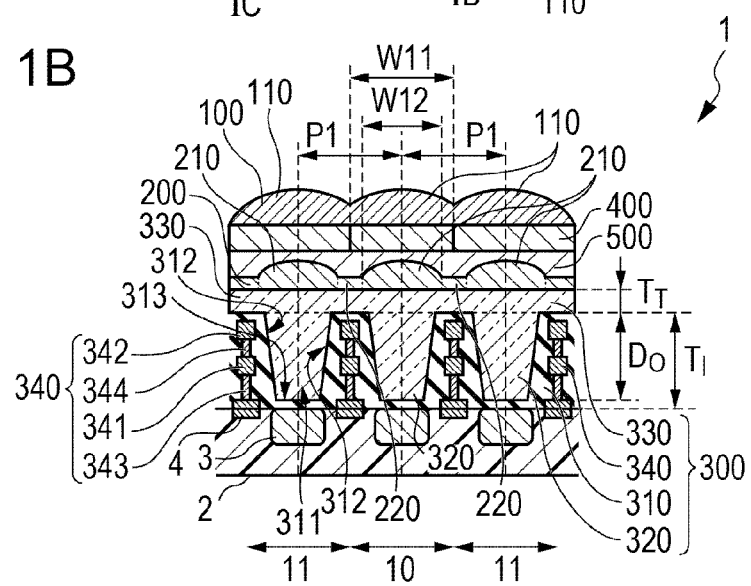
FIG. 1B is an explanatory cross-sectional view taken along the lines IB-IB and IB'-IB' in FIG. 1A.
Figure 1C:
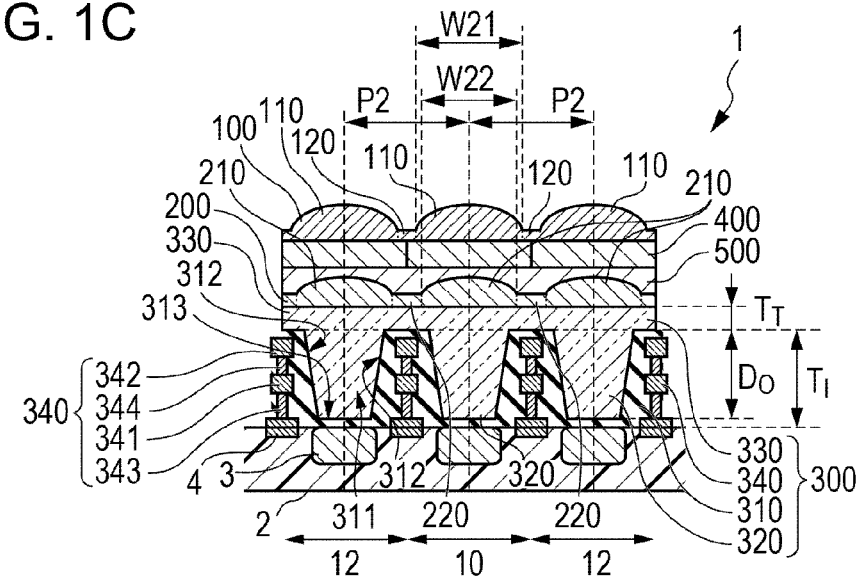
FIG. 1C is an explanatory cross-sectional view taken along the lines IC-IC and IC'-IC' in FIG. 1A.

Referring now to FIGS. 1A to 1C, an outline of a photoelectric conversion apparatus 1 will be described. The photoelectric conversion apparatus 1 includes a plurality of photodetectors 10, 11, and 12. FIG. 1A is a plan view of the photoelectric conversion apparatus 1 and illustrates nine photodetectors arranged two dimensionally in 3×3 matrix. However, the invention may be applied as long as the number of the photodetectors is two or more, and two or more photodetectors may be arranged one dimensionally.

One of the nine photodetectors (10, 11, 12), which is used only for explanation is defined as a photodetector of interest 10. In an example shown in FIG. 1A, the photodetector of interest 10 is located at the center, and there are eight photodetectors (11, 12) lying next to the photodetector of interest 10. The term "lie next to each other" in the embodiments means a mode in which another photodetector does not exist between the plurality of photodetectors, and includes both a case where the plurality of photodetectors border each other and a case where the plurality of photodetectors do not border each other (spaced apart from each other). In this specification, the term "next to each other" may be used in this meaning for various members as well as for the photodetectors. Terms "adjacent to" or "in proximity to" may mean both a case where a plurality of members border each other and a case where the plurality of members lie next to each other but do not border each other (spaced apart from each other).

Four (primary neighboring photodetectors 11) of the eight photodetectors (11, 12) lying next to the photodetector of interest 10 lie next to the photodetector of interest 10 in the directions of opposite sides (up, down, left, right directions in the drawing) thereof, and are arranged at shortest distances (pitches) from the photodetector of interest 10. The remaining four (secondary neighboring photodetectors 12) of the eight photodetectors (11, 12) lying next to the photodetector of interest 10 lie next to the photodetector of interest 10 in the direction of opposing corners (oblique directions in the drawing) thereof, and are arranged at positions farther from the photodetector of interest 10 in comparison with the primary neighboring photodetectors 11. The photodetector of interest 10, the primary neighboring photodetectors 11, and the secondary neighboring photodetectors 12 are discriminated on the basis of the relative positional relationships for the sake of convenience and may have substantially the same structure respectively. When there are only two photodetectors, or the photodetectors are arranged one dimensionally, the secondary neighboring photodetectors 12 do not exist. When there are six photodetectors arranged around the photodetector of interest in a regular hexagonal pattern, six primary neighboring photodetectors 11 and six secondary neighboring photodetectors 12 may exist.

FIG. 1B is a cross sectional view including the photodetector of interest 10 and the primary neighboring photodetectors 11 of the photoelectric conversion apparatus 1 taken along the lines IB-IB and IB'-IB' in FIG. 1A. FIG. 1C is a cross sectional view including the photodetector of interest 10 and the secondary neighboring photodetectors 12 of the photoelectric conversion apparatus 1 taken along the lines IC-IC and IC'-IC' in FIG. 1A. Although the structure shown in FIG. 1B may be established in only one of the cross section taken along the line IB-IB and the cross section taken along the line IB'-IB' shown in FIG. 1A, it is preferable to be established in both of these cross sections. In the same manner, although the structure shown in FIG. 1C may be established in only one of the cross section taken along the line IC-IC and the cross section taken along the line IC'-IC' shown in FIG. 1A, it is preferable to be established in both of these cross sections.

A semiconductor substrate 2 has a plurality of photoelectric conversion portions 3 and each of the photoelectric conversion portions 3 forms part of a corresponding one of the plurality of photodetectors. It is also possible to divide the photoelectric conversion portion 3 of each of the photodetectors into a plurality of regions so that each of the photodetectors has a photoelectric conversion portion having a plurality of photoelectric conversion regions. The semiconductor substrate 2 is typically formed of silicon. The photoelectric conversion portions 3 are each formed of a photodiode or a photogate, and generate signal carriers depending on the strength of the incident light beam thereupon. The semiconductor substrate 2 may have semiconductor devices 4 in addition to the photoelectric conversion portions 3. When the photoelectric conversion apparatus 1 is of a pixel amplifying type like so-called a CMOS sensor, an amplifier transistor, a transfer transistor, a reset transistor are included as possible examples of the semiconductor device 4. When the photoelectric conversion apparatus 1 is of a charge transfer type like a so-called CCD sensor, a charge-coupled device is included as the semiconductor device 4. As described above, when the photoelectric conversion portion 3 of each of the photodetectors is divided into a plurality of photoelectric conversion regions, a signal can be obtained from each of the photoelectric conversion regions. The photoelectric conversion portion 3 is typically formed by introducing (injection or diffusion) impurities into a monocrystal silicon wafer. However, the photoelectric conversion portion 3 may also be formed on a glass substrate as a thin film having an MIS type structure or a PIN type structure.

A composite member 300 formed by using a plurality of materials is provided so as to cover the plurality of the photoelectric conversion portions 3 on the semiconductor substrate 2. The composite member 300 includes at least an insulating film 310, high-refractive-index members 320, and a high-refractive-index film 330. The composite member 300 has at least an optical function and an electrical function.

The high-refractive-index members 320 and the high-refractive-index film 330 are transparent. In the embodiments, the term "transparent" means to have transparency with respect to light beams which can cause signal carriers to be generated by entering the photoelectric conversion portion 3. For example, when providing a wavelength selecting member such as a color filter as described later, the high-refractive-index members 320 and the high-refractive-index film 330 only have to have transparency with respect to the wavelengths of the light beams which have passed through the wavelength selecting member.

The insulating film 310 may be a multilayer film having a stacked plurality of insulating layers respectively formed of materials (insulating materials) different from each other. The insulating film 310 is typically transparent. Preferable examples of the material of the insulating film 310 include silicon oxide, silicon oxynitride, silicon nitride, BSG (borosilicate glass), PSG (phosphorous silicate glass), BPSG (boron phosphorous silicate glass). The refractive index of the insulating film 310 is preferably 1.4 to 1.6. A thickness $T_L$ of the insulating film 310 is preferably 0.55 μm or larger, and more preferably 1.0 μm or larger. When the thickness of the insulating film 310 is excessively large, the stress is increased and the time required for manufacture is increased. Therefore, practically, the thickness $T_L$ of the insulating film 310 is set so as not to exceed 10 μm.

The insulating film 310 includes a plurality of openings 311. The plurality of openings 311 are provided in regions where the photoelectric conversion portions 3 are located so as to correspond to the individual photoelectric conversion portions 3. Insides of the openings 311 are surrounded by the insulating film 310, and parts of a surface of the insulating film 310 constitute side surfaces 312 of the openings 311. In FIGS. 1B and 1C, different parts of the surface of the insulating film 310 constitute bottom surfaces 313 of the openings 311. However, the semiconductor substrate 2 may constitute the bottom surfaces 313 of the openings 311. In this manner, the openings 311 are depressions or through holes provided in the insulating film 310. When the semiconductor substrate 2 constitutes the bottom surfaces 313 of the openings 311, the openings 311 are provided so as to penetrate through the insulating film 310. However, in terms of reducing damage to the photoelectric conversion portions 3, the insulating film 310 preferably constitutes the bottom surfaces 313 of the openings 311. When etching the insulating film to form the openings 311, it may be achieved by providing an etching stop layer (not shown) on the insulating film and using the etching stop layer as the bottom surfaces 313 of the openings 311. When most of the insulating film 310 is formed of silicon oxide, it is recommended that the etching stop layer be formed of silicon nitride. A depth $D_o$ of the openings 311 is preferably ¼ of a thickness $T_I$ of the insulating film 310 or more, and more preferably ½ or more of the thickness $T_I$ of the insulating film 310.

The shape of the opening 311 in plan view (the shape of the opening 311 in a plane parallel to the semiconductor substrate 2) only has to be a closed loop, and a circle as shown in FIG. 1A, oval, rounded square, square, hexagon are applicable. The cross-sectional shape of the opening 311 (the shape of the opening 311 in a plane vertical to the semiconductor substrate 2) may be an inverted trapezoid as shown in FIGS. 1B and 1C, trapezoid, rectangle, square, or a staircase-like shape combining these shapes.

Each of the high-refractive-index members 320 is provided inside a corresponding one of the plurality of openings 311. Therefore, each of the plurality of high-refractive-index members 320 is surrounded by the insulating film 310. When the openings 311 are depressions of the insulating film 310, it may be said that the high-refractive-index members 320 are surrounded by part of the insulating film 310. The shape of the high-refractive-index members 320 substantially matches the shape of the opening 311. In the example shown in FIGS. 1A to 1C, the high-refractive-index members 320 have a truncated conical shape. However, they may have a truncated pyramid shape, a square column shape, or a circular column shape depending on the shape of the openings 311. A typical material (transparent material) of the high-refractive-index members 320 is an insulating material. The refractive index of the high-refractive-index members 320 is higher than the refractive index of the insulating film 310. In the example shown in FIGS. 1B and 1C, the high-refractive-index members 320 and the insulating film 310 border each other and form a boundary, and the boundary coincides with the side surfaces 312 of the openings 311. At this boundary, total reflection may occur depending on the difference between the refractive index of the high-refractive-index members 320 and the refractive index of the insulating film 310. Therefore, light beams directed toward the side surface 312 from among light beams having entered the high-refractive-index members 320 in the openings 311 can be reflected toward the photoelectric conversion portions 3.

The refractive index of the high-refractive-index film 330 is higher than the refractive index of the insulating film 310. The material of the high-refractive-index film 330 may be different from the material of the high-refractive-index members 320. The high-refractive-index film 330 may be formed of the same material (transparent material) as the high-refractive-index members 320. In the embodiments, the expression "the same material" means materials which are the same in stoichiometric composition. Therefore, materials shifted from the stoichiometric composition (that is, different in non-stoichiometric composition) and materials different in crystallinity, material density, impurities (not more than 1 wt %) and concentration thereof may be regarded as the "same material". For example, although materials whose ratios of the stoichiometric compositions of silicon nitride are Si:N=3:4, but different in actual ratio between Si and N from each other within a range in which the ratios of the stoichiometric compositions are the same are also considered to be the same material. Materials different in stoichiometric composition are not the same material. For example, although both of titanium monoxide (TiO) and titanium dioxide ($TiO_2$) are compositions of oxygen and titanium (titanium oxide), they are stoichiometrically different. In the description given below, the term "silicon oxide" means silicone dioxide ($SiO_2$) whose ratio of the stoichiometric composition is Si:O=1:2. Also, the term "silicon nitride" means trisilicon tetranitride ($Si_3N_4$) whose ratio of the stoichiometric composition is Si:N=3:4. The ratio of the stoichiometric compositions of other materials will be described using chemical composition formulas as needed.

The high-refractive-index film 330 is located on the insulating film 310. Then, the high-refractive-index film 330 extends from the top of the insulating film 310 to the top of the high-refractive-index members 320. More specifically, the high-refractive-index film 330 borders on the plurality of the high-refractive-index members 320. Consequently, the high-refractive-index film 330 is provided so as to couple the plurality of high-refractive-index members 320 with each other.

In the examples shown in FIGS. 1A and 1B, the high-refractive-index film 330 is provided so as to cover the high-refractive-index members 320 completely, in other words, so as to cover the openings 311. The high-refractive-index film 330, however, has only to border at least part of each of the high-refractive-index members 320. When the high-refractive-index members 320 and the high-refractive-index film 330 are formed of the same transparent member, the high-refractive-index members 320 and the high-refractive-index film 330 may be integrated and make clear observation of the boundary between the high-refractive-index members 320 and the high-refractive-index film 330 impossible. As described above, the high-refractive-index members 320 are located on the inside of the openings 311, and the high-refractive-index film 330 exists on the outside of the openings 311. Therefore, by determining whether the transparent material exists on the inside of the openings 311 or on the outside of the openings 311, the high-refractive-index members 320 and the high-refractive-index film 330 can be discriminated. The inside and the outside of the openings 311 can be marked off by extending an upper surface of the insulating film 310 imaginarily to the tops of the openings 311 (by connecting upper ends of the side surfaces 312 of the openings 311 imaginarily with respect to each other with a straight line) in an observation image of a cross section of the composite member 300 as indicated by dot lines in FIGS. 1B and 1C.

The materials (transparent materials) of the high-refractive-index members 320 or the high-refractive-index film 330 may be organic materials (resin). However, inorganic materials are preferable because they are chemically stable.

Examples of the preferable resin include siloxane-based resin and polyimide. Examples of the preferable inorganic material include silicon nitride, silicon oxynitride, titanium oxide ($TiO_2$), and specifically, silicon nitride is preferable. The refractive indices of the high-refractive-index members 320 and the high-refractive-index film 330 are preferably 1.6 or higher. The refractive indices of general resin are 1.3 to 1.6, and even those of high-refractive-index resins are 1.6 to 1.8. However, the effective refractive index can be enhanced by mixing a high-refractive-index inorganic material such as metallic oxide or the like. Examples of the high-refractive-index inorganic material to be contained in the resin include titanium oxide, tantalum oxide, niobium oxide, tungsten oxide, zirconium oxide, zinc oxide, indium oxide, and hafnium oxide. If a thickness $T_T$ of the high-refractive-index film 330 is at least $\lambda/4n_{330}$, where $\lambda$ is the wavelength of the light beam entering the high-refractive-index members 320, and $n_{330}$ is the refractive index of the high-refractive-index film 330, a remarkable effect may be achieved. The thickness $T_T$ of the high-refractive-index film 330 is typically 0.10 μm or larger. In contrast, if the thickness of the high-refractive-index film 330 is excessively increased, the incident light amount into the openings 311 is decreased. The thickness $T_T$ of the high-refractive-index film 330 preferably does not exceed the depth Do of the openings 311, and more preferably does not exceed half the depth Do of the openings 311. If the thickness $T_T$ of the high-refractive-index film 330 is not more than $2\lambda/n_T$, where $\lambda$ is the wavelength of the light beam entering the high-refractive-index members 320, and $n_T$ is the refractive index of the high-refractive-index film 330, a remarkable effect may be achieved.

Rough values of the refractive indices of the materials exemplified as materials of the high-refractive-index members 320, the high-refractive-index film 330, and the insulating film 310 are shown below. The values are 1.4 to 1.5 for silicone oxide, 1.6 to 1.9 for silicon oxynitride, 1.8 to 2.3 for silicon nitride, 2.5 to 2.7 for titanium oxide, and 1.4 to 2.0 for BSG, PSG, and BPSG. The values described above are only examples, and the ratio of the nonstoichiometric composition or the material density vary by changing the method of film formation even the materials are the same, and hence the refractive index can be set as needed.

When the insulating film 310 is a multilayer film, the refractive index of layers of part of the multilayer film may be the refractive index of the high-refractive-index members 320 or higher. However, it is not preferable that a layer having a refractive index equal to or higher than that of the high-refractive-index members 320 (a high-refractive-index insulating layer: not shown) constitutes most part of the side surfaces 312 of the openings 311. The reason is that the light beams entering the high-refractive-index members 320 may be propagated in the high-refractive-index insulating layers and leak from the openings 311. Therefore the side surfaces 312 of the openings 311 which are formed of the high-refractive-index insulating layer are preferably not more than half the entire surface area of the side surfaces 312 of the openings 311, and more preferably, not more than ¼ thereof. In other words, layers having a refractive index lower than that of the high-refractive-index members 320 (low-refractive-index insulating layer) in the multilayer film constitute at least half, more preferably ¾ of the entire surface area of the side surfaces 312 of the openings 311. The surface areas of the side surfaces 312 of the openings 311 formed by the respective layers may be adjusted by setting the thicknesses of the respective layers and the angles of the side surfaces 312 of the openings 311 as needed. The thickness of one low-refractive-index insulating layer is typically at least 0.10 μm. The thickness of one high-refractive-index insulating layer is preferably not higher than $\lambda/2n_{HI}$ and, more preferably, not higher than $\lambda/4n_{HI}$, where $\lambda$ is the wavelength of the light beam entering the high-refractive-index members 320, and $n_{HI}$ is the refractive index of the high-refractive-index insulating layer. The thickness of the high-refractive-index insulating layer is typically not larger than 0.10 μm.

An intraformational lens layer is provided on the composite member 300, and an intermediate film 500 is provided on the intraformational lens layer, a wavelength selecting layer 400 is provided on the intermediate film 500, and a top lens layer (microlens layer) is provided on the wavelength selecting layer 400. In the following description, the top lens layer is referred to as a first lens layer 100, and the intraformational lens layer is referred to as a second lens layer 200. The second lens layer 200 is located between the first lens layer 100 and the composite member 300.

Common points between the first lens layer 100 and the second lens layer 200 will be described. The respective lens layer have a plurality of collective lens portions. More specifically, the first lens layer 100 includes a plurality of first collective lens portions 110 and the second lens layer 200 includes a plurality of second collective lens portions 210. Each of the plurality of first collective lens portions 110 and each of the plurality of second collective lens portions 210 constitute part of one of the photodetectors, and are located corresponding to individual photoelectric conversion portions 3. As described later, at least one of (1) the first collective lens portions 110 lying next to each other from among the plurality of first collective lens portions 110 and (2) the second collective lens portions 210 lying next to each other from among the plurality of second collective lens portions 210 border each other.

What is essential about the shape of each of the collective lens portions is that the surface on the light incident side (upper side on the drawing) has a convex surface (convex lens shape) curving so as to project toward the incident side or the surface on the light exit side (lower side on the drawing) has a convex surface (convex lens shape) curving so as to project toward the light exit side. Examples of the shapes of the curved surface include an ideal spherical surface shape, a substantially spherical surface shape, and an aspherical surface shape.

Although the collective lens portions in FIGS. 1B and 1C have a planar convex lens shape projecting upward, a biconvex lens shape and a convex meniscus shape are also applicable. The refractive index of the collective lens portion is set to be higher than the refractive index of films (the intermediate film 500 and the wavelength selecting layer 400 in this case) which form an interface with respect to surfaces of the convex lens shape of the collective lens portions. The incident light beams can be collected owing to the convex lens shape of the collective lens portions and their refractive index thereof. When providing both of the first lens layer 100 and the second lens layer 200, the incident light beams collected by the first collective lens portions 110 are further collected by the second collective lens portions 210. It is also possible to provide divergent lens portions having a concave lens shape in the optical path. The refractive index of the divergent lens portions is also set to be higher than the refractive index of a film forming an interface with respect to surfaces having the concave lens shape. For example, although the intermediate film 500 has a concave lens shape on the lower surface thereof, since the refractive index is lower than the second lens layer 200, the intermediate film 500 does not work as the divergent lens portions.

The materials of the first lens layer 100 and the second lens layer 200 may be organic materials (resin) and inorganic materials. The refractive index of the first lens layer 100 and the refractive index of the second lens layer 200 may be the same, and may not be the same. However, the refractive index of the second lens layer is preferably higher than the refractive index of the first lens layer. For example, it is desirable to use a resin as the material of the first lens layer 100 and silicon nitride as the material of the second lens layer 200. The material of the second lens layer 200 may be the same as at least one of the material of the high-refractive-index film 330 and the material of the high-refractive-index members 320.

The collective lens portion (second collective lens portions 210) is a portion included in a geometry orthogonal projection with respect to the semiconductor substrate 2 of a region having the convex lens shape (curved region) on the surface of the lens layer (second lens layer 200). A connecting portion shown in FIG. 1B (second connecting portion 220) is a portion included in a geometry orthogonal projection with respect to the semiconductor substrate 2 of a region which does not have a convex lens shape and is substantially flat (flat surface region) on the surface of the lens layer. The lens layer will be described in detail using the fourth to eighth modifications described later.

In FIG. 1B, optical axes of the respective first collective lens portions 110 and optical axes of the respective second collective lens portions 210 are shown by long broken lines. Here, the optical axes of the first collective lens portions 110 and the optical axes of the second collective lens portions 210 match. However, the optical axes may be shifted within a range in which the light beams collected by the first collective lens portions 110 can enter the second collective lens portions 210. The optical axes of the first collective lens portions 110 of the primary neighboring photodetectors 11 are apart from a predetermined distance P1 from the optical axis of the first collective lens portion 110 of the photodetector of interest 10. The widths of the first collective lens portions 110 in the cross section taken along the line IB-IB and the cross-section taken along the line IB'-IB' are expressed by W11.

Also, since the optical axes of the first collective lens portions 110 and the optical axes of the second collective lens portions 210 match, the optical axes of the second collective lens portions 210 of the primary neighboring photodetectors 11 are apart from the optical axis of the second collective lens portion 210 of the photodetector of interest 10 by the predetermined distance P1. Typically, the predetermined distance P1 is not larger than 10 µm, preferably not larger than 5.0 µm, and further preferably, not larger than 2.0 µm. The widths of the respective second collective lens portions 210 in the cross section taken along the line IB-IB and the cross-section taken along the line IB'-IB' are expressed by W12.

In FIG. 1C as well, the optical axes of the respective first collective lens portions 110 and the optical axes of the respective second collective lens portions 210 are shown by long broken lines. A distance between the optical axis of the first collective lens portion 110 of the photodetector of interest 10 and the first collective lens portions 110 of the secondary neighboring photodetectors 12 is expressed by P2. The distance P2 is longer than the predetermined distance P1. Here, since the plurality of first collective lens portions 110 are arranged in a tetragonal lattice pattern, an expression P2=√2× P1 is established. The widths of the respective first collective lens portions 110 in the cross section taken along the line IC-IC and the cross-section taken along the line IC'-IC' are expressed by W21.

Also, since the optical axes of the first collective lens portions 110 and the optical axes of the second collective lens portions 210 match, the optical axes of the second collective lens portions 210 of the secondary neighboring photodetectors 12 are apart from the optical axis of the second collective lens portion 210 of the photodetector of interest 10 by the distance P2. The widths of the respective second collective lens portions 210 in the cross section taken along the line IC-IC and the cross-section taken along the line IC'-IC' are expressed by W22.

If the contour of the first collective lens portions 110 is a circle, an expression W11=W21 is established, and if the contour of the second collective lens portions 210 is a circle, an expression W12=W22 is established. Since the first collective lens portions 110 and the second collective lens portions 210 have a rounded square shape in the example shown in FIG. 1A, expressions W11<W21, and W12<W22 are established.

Wiring 340 for electrically connecting the semiconductor devices 4 provided on the semiconductor substrate 2 may be provided in the interior of the insulating film 310. The wiring 340 may be multilayer wiring. In the example in FIG. 1B, the wiring 340 includes a first wiring layer 341, a second wiring layer 342, a first contact layer 343, and a second contact layer 344. The first contact layer 343 connects the semiconductor device 4 and the first wiring layer 341, and the second contact layer 344 connects the first wiring layer 341 and the second wiring layer 342. Although the example in which the wiring layer has two layers has been described, it is also possible to provide another wiring layer between the first wiring layer 341 and the second wiring layer 342 to form a wiring layer having three or more layers. The wiring 340 constitutes part of the composite member 300. The wiring 340 may be formed of conductive materials such as copper, aluminum, tungsten, tantalum, and polysilicon. The typical wiring 340 is opaque and has a metallic gloss.

The wavelength selecting layer 400 may configure a multicolor filter by arranging a plurality of types of wavelength selecting members (color filters) provided so as to correspond respectively to the individual photoelectric conversion portions 3 and correspond to the wavelengths different from each other. The types of the wavelength selecting members may be elementary color system (RGB), or complementary color system (CMY), but the wavelengths corresponding thereto are not limited to visible light beams. It is also possible to use one type of wavelength selecting member to let light beams having one wavelength to enter the plurality of respective photoelectric conversion portions 3. When using a plurality of types of wavelength selecting members, Bayer arrangement or Stripe arrangement may be employed. For example, when using the wavelength selecting layer 400 of the Bayer arrangement, when the photodetector of interest 10 has a wavelength selecting member for green, the primary neighboring photodetectors 11 have a photodetector having a wavelength selecting member for blue and a photodetector having a wavelength selecting member for red. Also, all of the secondary neighboring photodetectors 12 are photodetectors having a wavelength selecting member for green.

Although the example in which the wavelength selecting layer 400 is positioned between the first lens layer 100 and the second lens layer 200 has been described, the wavelength selecting layer 400 may be positioned between the second lens layer 200 and the composite member 300. Although the wavelength selecting layer 400 may be provided on the first lens layer 100, it is liable to cause color mixture. Therefore, the wavelength selecting layer 400 is preferably provided between the first lens layer 100 or the second lens layer 200 and the composite member 300. The wavelength selecting layer 400 may be eliminated from the photoelectric conversion apparatus 1. In an image sensing system described later, the wavelength selecting member may be provided at a position apart from the photoelectric conversion apparatus 1 instead of the eliminated wavelength selecting layer 400.

The intermediate film 500 is located between the first lens layer 100 and the second lens layer 200. The intermediate film 500 functions, for example, as a flattening film for providing the first lens layer 100 having a planar convex lens shaped first collective lens portions 110 on the second lens layer 200 having a planer convex lens shaped second collective lens portions 210. The refractive index of the intermediate film 500 is set to be lower than those of the first lens layer 100 and the second lens layer 200. The intermediate film 500 may be a multilayer film.

Referring now to FIG. 1A to FIG. 7, embodiments of the invention will be described. In the description, parts having the same function are designated by the same reference numerals, and detailed description will be omitted.

First Embodiment

Referring now to FIGS. 1A to 1C, the photoelectric conversion apparatus 1 according to a first embodiment will be described. In FIG. 1A, dot lines indicate contours of the plurality of the first collective lens portions 110, broken lines indicate contours of the second collective lens portions 210, and solid lines indicate upper end of the side surfaces 312 of the openings 311.

As illustrated in FIGS. 1A and 1B, in the first lens layer 100, the first collective lens portion 110 of the photodetector of interest 10 and the first collective lens portions 110 of the primary neighboring photodetectors 11 border each other. In contrast, as illustrated in FIGS. 1A and 1B, in the second lens layer 200, the second collective lens portion 210 of the photodetector of interest 10 and the second collective lens portions 210 of the primary neighboring photodetectors 11 are spaced apart from each other. Provided between the second collective lens portion 210 of the photodetector of interest 10 and the second collective lens portions 210 of the primary neighboring photodetectors 11 are the second connecting portions 220 having no light collecting function. As illustrated in FIGS. 1A and 1C, in the first lens layer 100, the first collective lens portion 110 of the photodetector of interest 10 and the first collective lens portions 110 of the secondary neighboring photodetectors 12 are spaced apart from each other. Provided between the second collective lens portion 210 of the photodetector of interest 10 and the second collective lens portions 210 of the secondary neighboring photodetectors 12 are the second connecting portions 220 having no light collecting function. Also, as illustrated in FIGS. 1A and 1C, in the second lens layer 200, the second collective lens portion 210 of the photodetector of interest 10 and the second collective lens portions 210 of the primary neighboring photodetectors 11 are spaced apart from each other. Provided between the second collective lens portion 210 of the photodetector of interest 10 and the second collective lens portions 210 of the secondary neighboring photodetectors 12 are the second connecting portions 220 having no light collecting function.

Bordering of the collective lens portions with respect to each other is substantially synonymous with that the distances (pitches) between the optical axis of the collective lens portion of the photodetector of interest 10 and the optical axes of the collective lens portions of the primary neighboring photodetectors 11 and the secondary neighboring photodetectors 12 are the same as the width of the collective lens portion of the photodetector of interest 10 in the direction of connection of the optical axes. The optical axis of the collective lens portion is an axis including a distal end of an incident surface or an exit surface of the collective lens portion, and typically, an axis including the center of curvature of the curved shape of the collective lens portion. The optical axis may be referred to as a center axis (axis of rotational symmetry). The curvature of the first collective lens portions 110 is preferably not lower than 0.49 (1/μm). For example, the curvatures of the first collective lens portions 110 next to each other may be 0.63 (1/μm). In contrast, the curvature of the second collective lens portions 210 is preferably larger than the curvature of the first collective lens portions 110, that is, the radius of curvature of the second collective lens portions 210 is preferably smaller than the radius of curvature of the first collective lens portions 110.

If the collective lens portions of the primary neighboring photodetectors 11 are apart from the collective lens portion of the photodetector of interest 10, the distances (pitches) between the optical axis of the collective lens portion of the photodetector of interest 10 and the optical axes of the collective lens portions of the primary neighboring photodetectors 11 become larger than the width of the collective lens portion of the photodetector of interest 10. The width of the collective lens portion of the photodetector of interest 10 here means the width of the collective lens portion in the direction of connecting the optical axes of the both (the direction of the opposite sides). In the same manner, if the collective lens portions of the secondary neighboring photodetectors 12 are apart from the collective lens portion of the photodetector of interest 10, the distances (pitches) between the optical axis of the collective lens portion of the photodetector of interest 10 and the optical axes of the collective lens portions of the secondary neighboring photodetectors 12 become larger than the width of the collective lens portion of the photodetector of interest 10. The width of the collective lens portion of the photodetector of interest 10 here means the width of the collective lens portion in the direction of connecting the optical axes of the both (the direction of the opposite corners). Also, the height of the boundary between the collective lens portions bordering on each other may be the same as the height of the connecting portion, but typically higher than the connecting portion.

Referring now to FIGS. 1B and 1C, the relationship between the pitch and the width will be described in detail. As shown in FIG. 1B, since the first collective lens portion 110 of the photodetector of interest 10 and the first collective lens portions 110 of the primary neighboring photodetectors 11 border each other, an expression W11=P1 is established. Since the second collective lens portion 210 of the photodetector of interest 10 and the second collective lens portions 210 of the primary neighboring photodetectors 11 are spaced apart from each other, an expression W12<P1 is established. In other words, the second collective lens portion 210 of the photodetector of interest 10 and the second collective lens portions 210 of the primary neighboring photodetectors 11 are spaced apart from each other by P1-W12.

As shown in FIG. 1C, since the first collective lens portion 110 of the photodetector of interest 10 and the first collective lens portions 110 of the secondary neighboring photodetectors 12 are spaced apart from each other, an expression W21<P2 is established. In other words, the first collective lens portion 110 of the photodetector of interest 10 and the first collective lens portions 110 of the primary neighboring photodetectors 11 are spaced apart from each other by P2-W21. Since the second collective lens portion 210 of the photodetector of interest 10 and the second collective lens portions 210 of the secondary neighboring photodetectors 12 are spaced apart from each other, an expression W22<P2 is established. In other words, the second collective lens portion 210 of the photodetector of interest 10 and the second collective lens portions 210 of the primary neighboring photodetectors 11 are spaced apart from each other by P2-W22.

Figure 8:
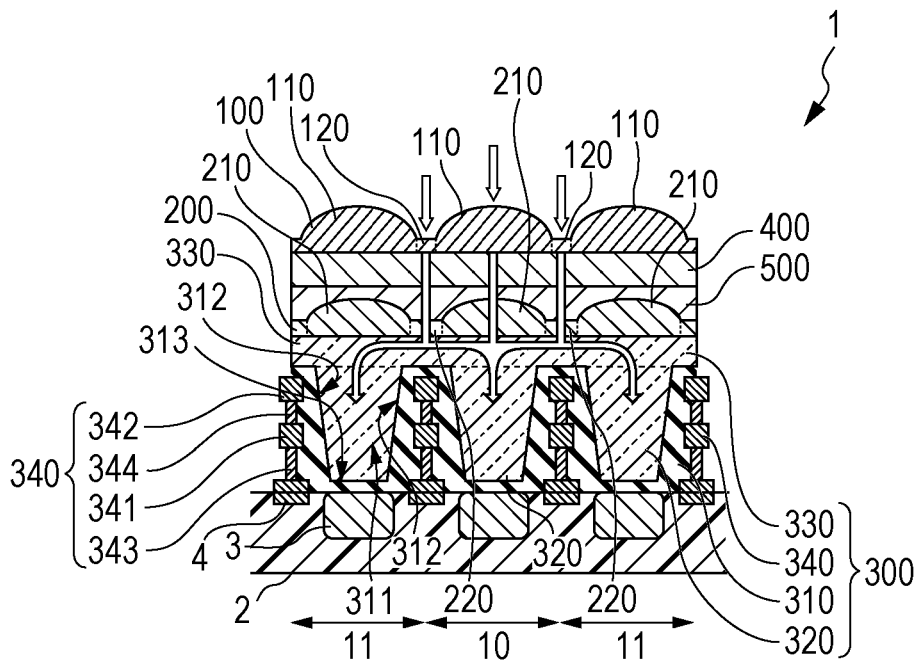
FIG. 8 is an explanatory schematic drawing of the invention.

Referring now to FIG. 8, which is a modification from the first embodiment in FIG. 1B for comparison, the embodiments will be described. As shown in FIG. 8, the first collective lens portions 110 lying next to each other in the first lens layer 100 are spaced apart from each other, and the second collective lens portions 210 lying next to each other in the second lens layer 200 are also apart from each other. Therefore, when the light beams entering first connecting portions 120 between the first collective lens portions 110 lying next to each other are not substantially collected, and enter portions between the second collective lens portions 210 lying next to each other without bending the optical path thereof. Then, the light beam having entered the second connecting portion 220 between the second collective lens portions 210 enters the high-refractive-index film 330. Since the high-refractive-index film 330 has a refractive index higher than the insulating film 310, the incident light beams propagate in the high-refractive-index film 330 as is explained in geometric optics or wave optics. Such propagation of light beams in the high-refractive-index film 330 occurs readily when the distance between the optical axes of the collective lens portions of the photodetector of interest 10 and the primary neighboring photodetectors 11 (the predetermined distance P1) does not exceed 5.0 µm and becomes specifically remarkable when it does not exceed 2.0 µm. Since the high-refractive-index film 330 connects the high-refractive-index members 320 to each other, the light beams having propagated through the high-refractive-index film 330 are guided to the separate high-refractive-index members 320. This is because that the light beams have a property to propagate through a medium having a higher refractive index (the high-refractive-index members 320) more readily than a medium having a lower refractive index (the insulating film 310) in terms of the wave optics. Specifically, when the high-refractive-index members 320 and the high-refractive-index film 330 are formed of the same member, the loss of the light beam between the high-refractive-index film 330 and the high-refractive-index members 320 becomes smaller in comparison with a case where the high-refractive-index members 320 and the high-refractive-index film 330 are formed of materials different from each other. Therefore, the influences upon the propagation of the light beams in the high-refractive-index film 330 and the propagation to the high-refractive-index members 320 may be significant. The light beams guided to the separate high-refractive-index members 320 enter the separate photoelectric conversion portions 3 and generate electric charges. Therefore, it is considered that the edge of an image is blurred because the light beams which originally may enter only the photoelectric conversion portion 3 of the photodetector of interest 10 enter also the photoelectric conversion portions 3 of the primary neighboring photodetectors 11. Furthermore, when the wavelength selecting layer 400 having a plurality of types of wavelength selecting layers is used, the light beams having wavelengths which originally may enter only the photodetector of interest 10 enter also the primary neighboring photodetectors 11 having wavelength selecting members which support different wavelengths. When the wavelength selecting members which support different wavelengths border each other, specifically, when they border in an overlapped manner in a region on the high-refractive-index film 330, light beams having a plurality of wavelength bands (color mixed light beams) enter the high-refractive-index film 330, and then enter the high-refractive-index members 320. This is considered to cause color mixture in images. Entry of light beams to a portion between the photodetector of interest 10 and the secondary neighboring photodetectors 12 may be explained in the same manner.

In the first embodiment, the first collective lens portion 110 of the photodetector of interest 10 and the first collective lens portions 110 of the primary neighboring photodetectors 11 border each other. Therefore, the light beams having entered the boundaries between the first collective lens portion 110 of the photodetector of interest 10 and the first collective lens portions 110 of the primary neighboring photodetectors 11 can be collected by any one of the both first collective lens portions 110. Therefore, the optical path is bent in the direction toward a light guide member, and entry into the high-refractive-index film 330 can be inhibited. Therefore, lowering of light receiving accuracy caused by the light beams entering the high-refractive-index film 330 and propagating therethrough can be inhibited.

Second Embodiment

Figure 2A:
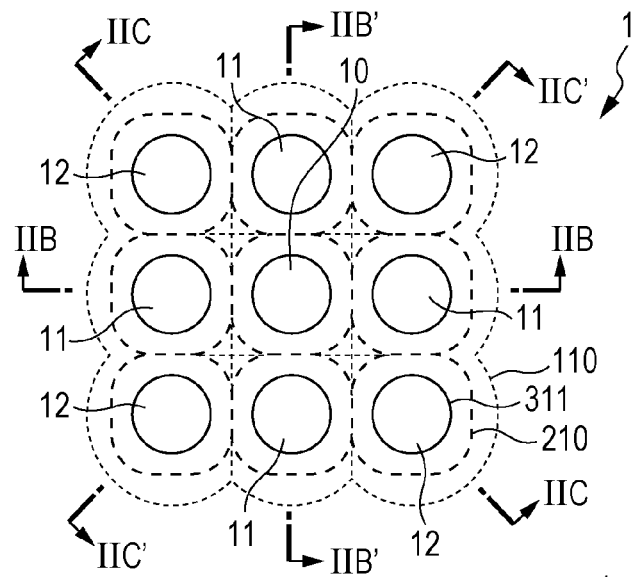
FIG. 2A is an explanatory schematic plan view of a photoelectric conversion apparatus according to a second embodiment.
Figure 2B:
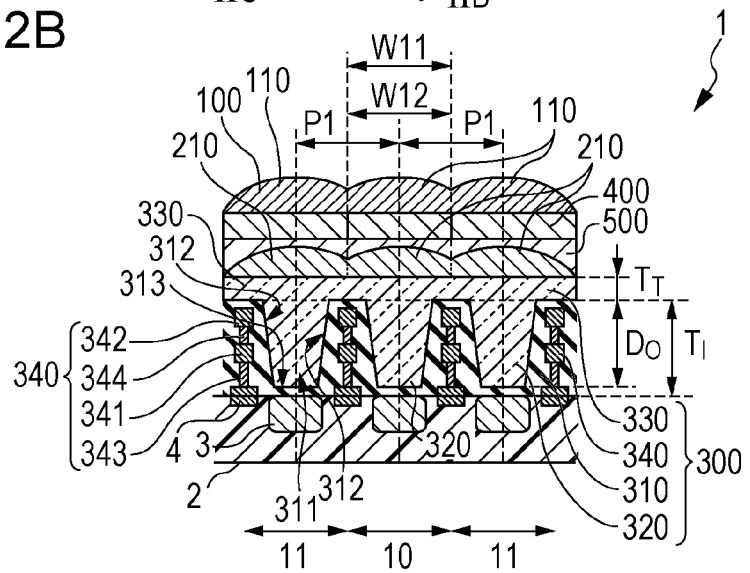
FIG. 2B is an explanatory cross-sectional view taken along the lines IIB-IIB and IIB'-IIB' in FIG. 2A.
Figure 2C:
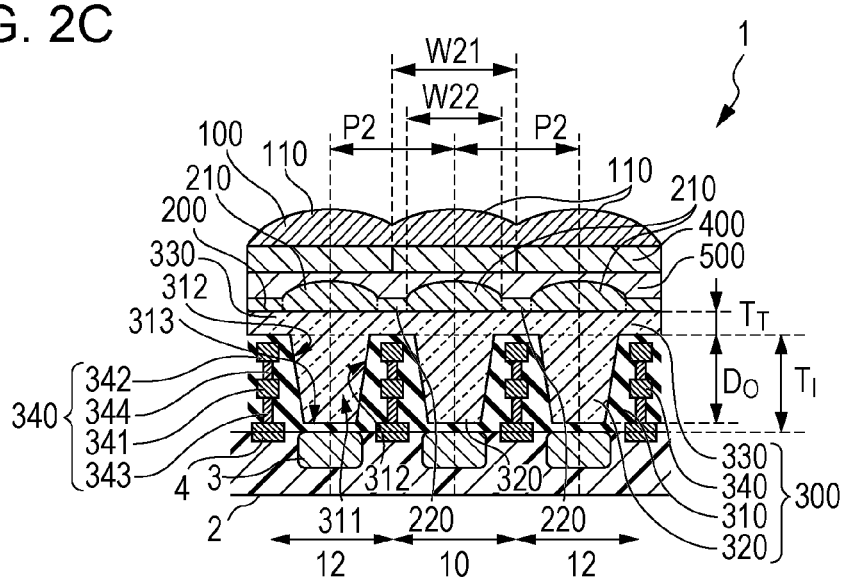
FIG. 2C is an explanatory cross-sectional view taken along the lines IIC-IIC and IIC'-IIC' in FIG. 2A.

Referring now to FIGS. 2A to 2C, the photoelectric conversion apparatus 1 according to a second embodiment will be described. FIG. 2A is a plan view of the photoelectric conversion apparatus 1 and in FIG. 2A, dot lines indicate contours of the plurality of the first collective lens portions 110, broken lines indicate contours of the second collective lens portions 210, and solid lines indicate the side surfaces 312 of the openings 311. FIG. 2B is a cross sectional view including the photodetector of interest 10 and the primary neighboring photodetectors 11 of the photoelectric conversion apparatus 1 taken along the lines IIB-IIB and IIB'-IIB' in FIG. 2A. FIG. 2C is a cross sectional view including the photodetector of interest 10 and the secondary neighboring photodetectors 12 of the photoelectric conversion apparatus 1 taken along the lines IIC-IIC and IIC'-IIC' in FIG. 2A. Although the structure shown in FIG. 2B may be established only in one of the cross section taken along the line IIB-IIB and the cross section taken along the line IIB'-IIB' shown in FIG. 2A, it is preferably established in both of these cross sections. In the same manner, although the structure shown in FIG. 2C may be established only in one of the cross section taken along the line IIC-IIC and the cross section taken along the line IIC'-IIC' shown in FIG. 2A, it is preferable to be established in both of these cross sections.

As illustrated in FIGS. 2A and 2B, in the first lens layer 100, the first collective lens portion 110 of the photodetector of interest 10 and the first collective lens portions 110 of the primary neighboring photodetectors 11 border each other. Also, as illustrated in FIGS. 2A and 2B, in the second lens layer 200, the second collective lens portion 210 of the photodetector of interest 10 and the second collective lens portions 210 of the primary neighboring photodetectors 11 border each other. As illustrated in FIGS. 2A and 2C, in the first lens layer 100, the first collective lens portion 110 of the photodetector of interest 10 and the first collective lens portions 110 of the secondary neighboring photodetectors 12 border each other. In contrast, as illustrated in FIGS. 2A and 2C, in the second lens layer 200, the second collective lens portion 210 of the photodetector of interest 10 and the second collective lens portions 210 of the secondary neighboring photodetectors 12 are spaced apart from each other. Provided between the second collective lens portion 210 of the photodetector of interest 10 and the second collective lens portions 210 of the secondary neighboring photodetectors 12 are the second connecting portions 220 having no light collecting function.

Referring now to FIGS. 2B and 2C, the relationship between the pitch and the width will be described in detail. Definitions of W11, P1, W12, W21, P2 and W22 shown in FIGS. 2B and 2C are the same as those in FIGS. 1B and 1C.

As shown in FIG. 2B, since the first collective lens portion 110 of the photodetector of interest 10 and the first collective lens portions 110 of the primary neighboring photodetectors 11 border each other, the expression W11=P1 is established. Since the second collective lens portion 210 of the photodetector of interest 10 and the second collective lens portions 210 of the primary neighboring photodetectors 11 border each other, an expression W12=P1 is established. An expression W12=W11 is also established.

As shown in FIG. 2C, since the first collective lens portion 110 of the photodetector of interest 10 and the first collective lens portions 110 of the secondary neighboring photodetectors 12 border each other, an expression W21=P2 is established. Although the photodetector of interest 10 and the first collective lens portions 110 of the primary neighboring photodetectors 11 border each other over a certain width, the photodetector of interest 10 and the first collective lens portions 110 of the secondary neighboring photodetectors 12 border each other at a substantially one point. Then, the contour of the first collective lens portion 110 of the photodetector of interest 10 is a square shape as shown in FIG. 2A. Since the second collective lens portion 210 of the photodetector of interest 10 and the second collective lens portions 210 of the secondary neighboring photodetectors 12 are spaced apart from each other, the expression W22<P2 is established. In other words, the second collective lens portion 210 of the photodetector of interest 10 and the second collective lens portions 210 of the secondary neighboring photodetectors 12 are spaced apart from each other by P2-W22.

In the second embodiment, the first collective lens portion 110 of the photodetector of interest 10 and the first collective lens portions 110 of the primary neighboring photodetectors 11 border each other, and the first collective lens portion 110 of the photodetector of interest 10 and the first collective lens portions 110 of the secondary neighboring photodetectors 12 border each other. Therefore, unlike the first embodiment, the first lens layer 100 does not have the first connecting portion 120. Therefore, the light beams having entered the first lens layer 100 are prevented from entering the second connecting portion 220 of the second lens layer 200 and the high-refractive-index film 330.

Third Embodiment

Figure 3A:
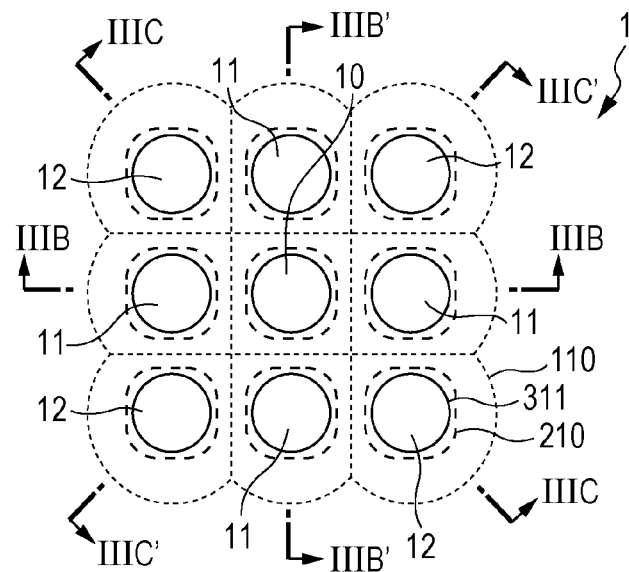
FIG. 3A is an explanatory schematic plan view of a photoelectric conversion apparatus according to a third embodiment.
Figure 3B:
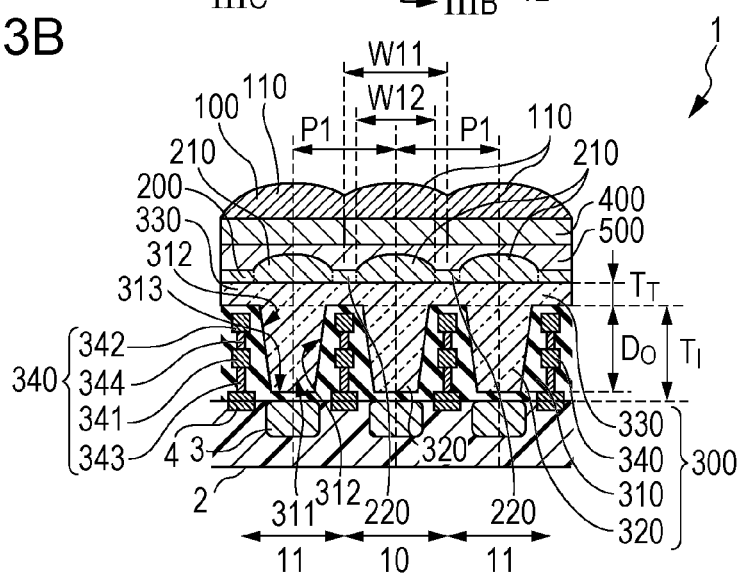
FIG. 3B is an explanatory cross-sectional view taken along the lines IIIB-IIIB and IIIB'-IIIB' in FIG. 3A.
Figure 3C:
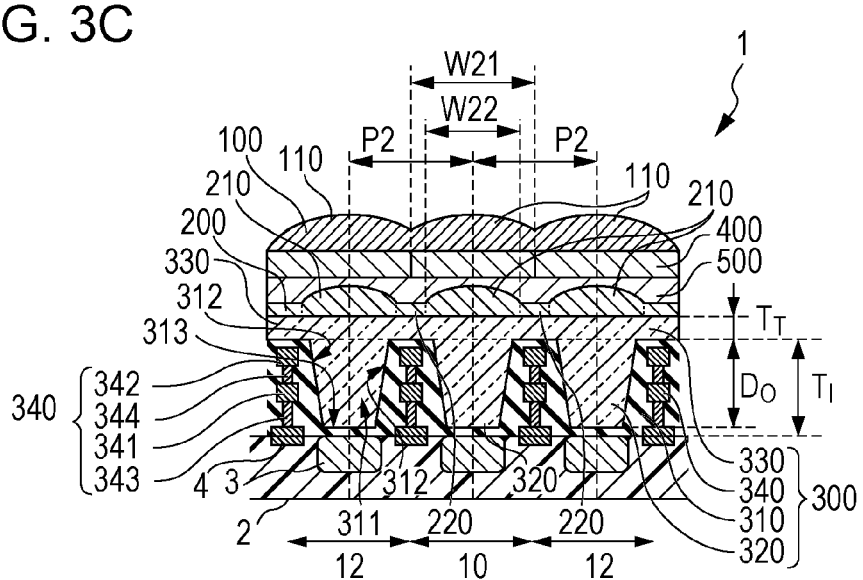
FIG. 3C is an explanatory cross-sectional view taken along the lines IIIC-IIIC and IIIC'-IIIC' in FIG. 3A.

Referring now to FIGS. 3A to 3C, the photoelectric conversion apparatus 1 according to a third embodiment will be described. FIG. 3A is a plan view of the photoelectric conversion apparatus 1 and in FIG. 3A, dot lines indicate contours of the plurality of the first collective lens portions 110, broken lines indicate contours of the second collective lens portions 210, and solid lines indicate the side surfaces 312 of the openings 311. FIG. 3B is a cross sectional view including the photodetector of interest 10 and the primary neighboring photodetectors 11 of the photoelectric conversion apparatus 1 taken along the lines IIIB-IIIB and IIIB'-IIIB' in FIG. 3A. FIG. 3C is a cross sectional view including the photodetector of interest 10 and the secondary neighboring photodetectors 12 of the photoelectric conversion apparatus 1 taken along the lines IIIC-IIIC and IIIC'-IIIC' in FIG. 3A. Although the structure shown in FIG. 3B may be established only in one of the cross section taken along the line IIIB-IIIB and the cross section taken along the line IIIB'-IIIB' shown in FIG. 3A, it is preferably established in both of these cross sections. In the same manner, although the structure shown in FIG. 3C may be established only in one of the cross section taken along the line IIIC-IIIC and the cross section taken along the line IIIC'-IIIC' shown in FIG. 3A, it is preferable to be established in both of these cross sections.

As illustrated in FIGS. 3A and 3B, in the first lens layer 100, the first collective lens portions 110 of the photodetector of interest 10 and the first collective lens portions 110 of the primary neighboring photodetectors 11 border each other. Also, as illustrated in FIGS. 3A and 3B, in the second lens layer 200, the second collective lens portion 210 of the photodetector of interest 10 and the second collective lens portions 210 of the primary neighboring photodetectors 11 are spaced apart from each other. Provided between the second collective lens portion 210 of the photodetector of interest 10 and the second collective lens portions 210 of the primary neighboring photodetectors 11 are the second connecting portions 220 having no light collecting function. In contrast, as illustrated in FIGS. 3A and 3C, in the first lens layer 100, the first collective lens portion 110 of the photodetector of interest 10 and the first collective lens portions 110 of the secondary neighboring photodetectors 12 border each other. Also, as illustrated in FIGS. 3A and 3C, in the second lens layer 200, the second collective lens portion 210 of the photodetector of interest 10 and the second collective lens portions 210 of the primary neighboring photodetectors 11 are spaced apart from each other. Provided between the second collective lens portion 210 of the photodetector of interest 10 and the second collective lens portions 210 of the secondary neighboring photodetectors 12 are the second connecting portions 220 having no light collecting function.

Referring now to FIGS. 3B and 3C, the relationship between the pitch and the width will be described in detail. Definitions of W11, P1, W12, W21, P2 and W22 shown in FIGS. 3B and 3C are the same as those in FIGS. 1B and 1C.

As shown in FIG. 3B, since the first collective lens portion 110 of the photodetector of interest 10 and the first collective lens portions 110 of the primary neighboring photodetectors 11 border each other, the expression W11=P1 is established. Since the second collective lens portion 210 of the photodetector of interest 10 and the second collective lens portions 210 of the primary neighboring photodetectors 11 are spaced apart from each other, the expression W12<P1 is established. An expression W12<W11 is also established.

As shown in FIG. 3C, since the first collective lens portion 110 of the photodetector of interest 10 and the first collective lens portions 110 of the secondary neighboring photodetectors 12 border each other, the expression W21=P2 is established. Since the second collective lens portion 210 of the photodetector of interest 10 and the second collective lens portions 210 of the secondary neighboring photodetectors 12 are spaced apart from each other, the expression W22<P2 is established. In other words, the second collective lens portion 210 of the photodetector of interest 10 and the second collective lens portions 210 of the primary neighboring photodetectors 11 are spaced apart from each other by P2-W22. An expression W22<W21 is also established.

The surface area of the second collective lens portions 210 is preferably set to be smaller than the surface area of the first collective lens portions 110 because the light beams collected by the first collective lens portions 110 enter the second collective lens portions 210. By reducing the surface area of the second collective lens portions 210, the second collective lens portions 210 can have a higher collecting performance (smaller curvature) without increasing the thickness of the second collective lens portions 210. In this embodiment, even when the surface area of the second collective lens portions 210 is reduced to be smaller than the surface area of the first collective lens portions 110, the light beams entering to portions between the second collective lens portions 210 may be reduced.

The invention is not limited to the first to the third embodiments. What is essential in the invention is that the collective lens portions of the photodetectors lying next to each other border each other in at least one of the first lens layer 100 and the second lens layer 200. Examples of other embodiments will be described below.

As a modification of the first embodiment, a configuration in which the second collective lens portion 210 of the photodetector of interest 10 and the second collective lens portions 210 of the primary neighboring photodetectors 11 border each other may be employed. As a modification of the first embodiment, a configuration in which the second collective lens portion 210 of the photodetector of interest 10 and the second collective lens portions 210 of the secondary neighboring photodetectors 12 border each other may be employed. As a modification of the second embodiment, a configuration in which the second collective lens portion 210 of the photodetector of interest 10 and the second collective lens portions 210 of the secondary neighboring photodetectors 12 border each other may be employed. As a modification of the second embodiment, a configuration in which the first collective lens portion 110 of the photodetector of interest 10 and the first collective lens portions 110 of the primary neighboring photodetectors 11 are spaced apart from each other, and the first collective lens portion 110 of the photodetector of interest 10 and the first collective lens portions 110 of the secondary neighboring photodetectors 12 are spaced apart from each other may be employed. As a modification of the second embodiment, a configuration in which the first collective lens portion 110 of the photodetector of interest 10 and the first collective lens portions 110 of the primary neighboring photodetectors 11 are spaced apart from each other, and the first collective lens portion 110 of the photodetector of interest 10 and the first collective lens portions 110 of the secondary neighboring photodetectors 12 are spaced apart from each other, and the second collective lens portion 210 of the photodetector of interest 10 and the second collective lens portions 210 of the secondary neighboring photodetectors 12 border each other may be employed.

Although the configurations having the two lens layers have been described, a configuration in which only one of the first lens layer 100 and the second lens layer 200 is provided and the other one of those is not provided may be employed. One of the aspects of disclosure is only that at least one lens layer having a plurality of collective lens portions is provided and the collective lens portions of the photodetectors lying next to each other border each other in the corresponding lens layer. For example, when the photodetector of interest 10 and the second collective lens portions 210 of the primary neighboring photodetectors are spaced apart from each other as the second lens layer 200 in the first embodiment and the third embodiment, the second lens layer 200 may be eliminated. Methods of forming collective lens portions lying next to each other may be realized by using the gradation exposure method, the etch back method, or the reflow method solely or in combination and setting conditions of these methods as needed. For example, Japanese Patent Laid-Open No. 2006-041467, Japanese Patent Laid-Open No. 2004-145319, Japanese Patent Laid-Open No. 61-67003, Japanese Patent Laid-Open No. 2008-277800, Japanese Patent Laid-Open No. 2008-52004, and Japanese Patent Laid-Open No. 2003-33254 may be referenced. In order to cause the collective lens portions lying next to each other in the direction of the opposite corners (the photodetector of interest 10 and the collective lens portions of the secondary neighboring photodetectors 12) to border each other, patterns for the collective lens portions in the direction of the opposite corners are set to be overlapped with each other by a sufficient surface area at the time of patterning of the respective collective lens portions. When providing the wavelength selecting layer 400 in a case where there is only one layer as the lens layer, the wavelength selecting layer 400 is preferably provided between the lens layer and the composite member 300.

Fourth Embodiment

Figure 4A:
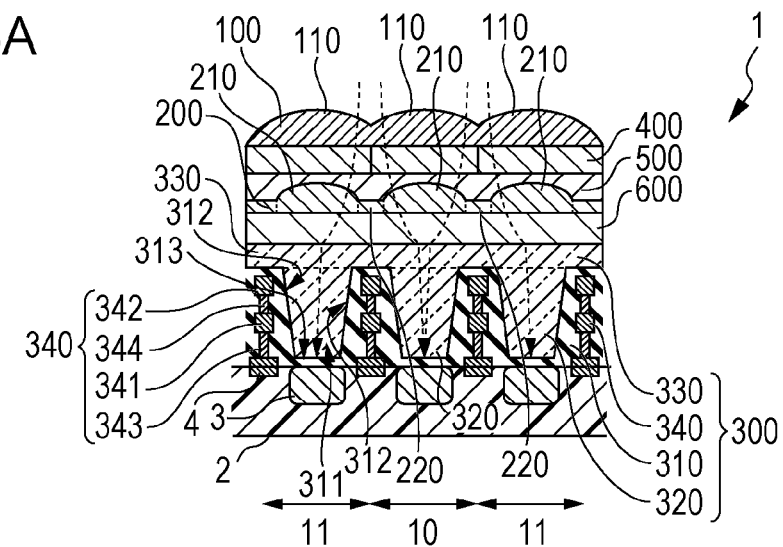
FIG. 4A is an explanatory schematic cross-sectional view of a photoelectric conversion apparatus according to a fourth embodiment showing a first example.
Figure 4B:
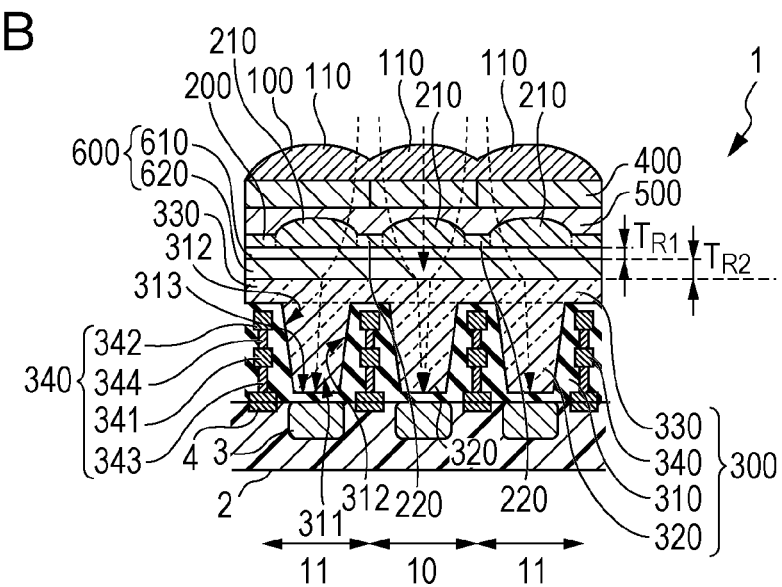
FIG. 4B is an explanatory cross-sectional view of the photoelectric conversion apparatus according to the fourth embodiment showing a second example.
Figure 4C:
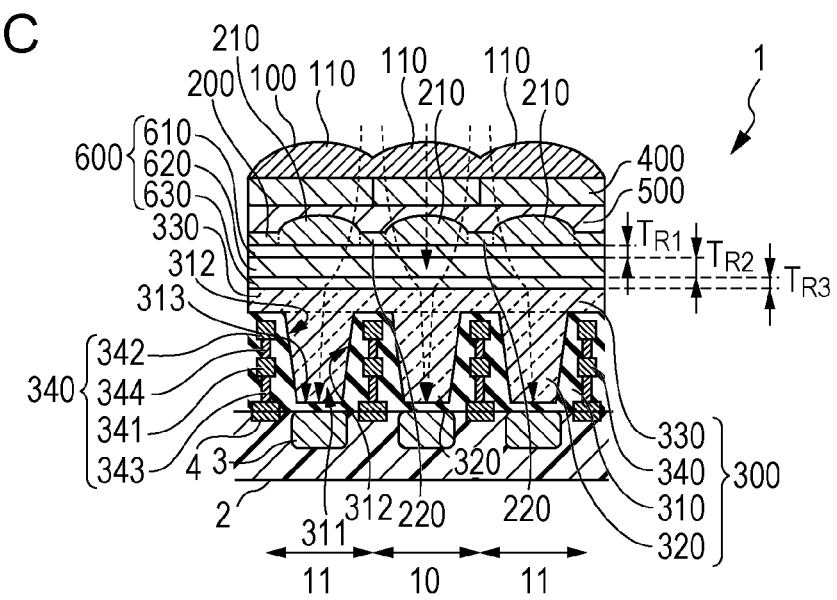
FIG. 4C is an explanatory cross-sectional view of the photoelectric conversion apparatus according to the fourth embodiment showing a third example.

Referring now to FIGS. 4A to 4C, the photoelectric conversion apparatus 1 according to a fourth embodiment will be described. FIG. 4A shows a first example of the fourth embodiment, FIG. 4B shows a second example of the fourth embodiment, and FIG. 4C shows a third example of the fourth embodiment, respectively. FIGS. 4A to 4C show examples in which the respective examples are applied to the first embodiment as shown in FIG. 1B. However, the fourth embodiment may be applied also to the second and third embodiments. The first to the third examples are common in that a transparent low-refractive-index film having a refractive index lower than that of the second lens layer 200 is provided between the second lens layer 200 and the high-refractive-index members 320. Although an example in which a low-refractive-index film 600 forms an interface with the high-refractive-index film 330 will be described below, the low-refractive-index film 600 may form the interface with respect to the high-refractive-index members 320.

In the first example, the low-refractive-index film 600 is a single layer film, and is provided between the second lens layer 200 and the high-refractive-index film 330. More specifically, an upper surface of the low-refractive-index film 600 forms an interface with respect to a lower surface of the second lens layer 200, and a lower surface of the low-refractive-index film 600 forms an interface with respect to an upper surface of the high-refractive-index film 330. For example, when the material of the second lens layer 200 is silicon nitride having a refractive index of 2.00, silicon oxynitride having a refractive index of 1.72 or silicon oxide having a refractive index of 1.46 may be used as the materials of the low-refractive-index film 600.

Light beams collected by the second collective lens portions 210 can enter obliquely with respect to the low-refractive-index film 600. The refractive index of the low-refractive-index film 600 is lower than the refractive index of the second lens layer 200, so that the light beams are refracted toward the centers (optical axes) of the openings 311 in the low-refractive-index film 600 according to Snell's Law. Therefore, the light amount entering the openings 311 may be increased. When the refractive index of the low-refractive-index film 600 is lower the refractive index of the high-refractive-index film 330, the light beams refracted in the low-refractive-index film 600 enter the high-refractive-index film 330 obliquely. The refractive index of the high-refractive-index film 330 is higher than the refractive index of the low-refractive-index film 600, so that the light beams are refracted in the direction reducing angles with respect to the centers (light axes) of the openings 311 in the high-refractive-index film 330 according to Snell's Law. Therefore, light fluxes which are totally reflected from the side surfaces 312 after having entered the openings 311 can be increased, and the light amount leaking from the side surfaces 312 of the openings 311 can be reduced. Practically, the refractive index of the low-refractive-index film 600 is preferably not more than 0.95 times, and preferably, not more than 0.85 times the refractive index of the second lens layer 200.

In the second example, the low-refractive-index film 600 is a multilayer film and includes a first low-refractive-index layer 610 and a second low-refractive-index layer 620. An upper surface of the first low-refractive-index layer 610 forms an interface with respect to the lower surface of the second lens layer 200, and the refractive index of the first low-refractive-index layer 610 is lower than the refractive index of the second lens layer 200. An upper surface of the second low-refractive-index layer 620 forms an interface with a lower surface of the first low-refractive-index layer 610, and the refractive index of the second low-refractive-index layer 620 is lower than the refractive index of the first low-refractive-index layer 610. A lower surface of the second low-refractive-index layer 620 forms an interface with respect to the upper surface of the high-refractive-index film 330. Therefore, the first low-refractive-index layer 610 has a refractive index between the refractive index of the second lens layer 200 and the refractive index of the second low-refractive-index layer 620. This example may be considered to be an example in which the single-layer low-refractive-index film 600 in the first example is regarded as the second low-refractive-index layer 620, and the first low-refractive-index layer 610 is provided between the single-layer low-refractive-index film 600 in the first example and the second lens layer 200. For example, when the material of the second lens layer 200 is silicon nitride, silicon oxynitride may be used as the material of the first low-refractive-index layer 610 and silicon oxide may be used as the materials of the second low-refractive-index layer 620. Practically, the refractive index of a layer having a lowest refractive index (the second low-refractive-index layer 620 in this example) is preferably from 1.40 to 1.60.

In the case of the first example, there may arise reflection of vertical incident light beams on the interface between the second lens layer 200 and the low-refractive-index film 600 due to the difference in refractive index between the second lens layer 200 and the low-refractive-index film 600. A reflectivity R at this time can be expressed by an expression, $R=(n_{200}-n_{600})^2/(n_{200}+n_{600})^2$, where $n_{200}$ is the refractive index of the second lens layer 200, and $n_{600}$ is the refractive index of the low-refractive-index film 600. In the second example, both of the difference in refractive index between the second lens layer 200 and the first low-refractive-index layer 610, and the difference in refractive index between the first low-refractive-index layer 610 and the second low-refractive-index layer 620 are smaller than the difference in refractive index between the second lens layer 200 and the second low-refractive-index layer 620. Therefore, coefficient of transmission at the interface between the second lens layer 200 and the first low-refractive-index layer 610, and coefficient of transmission at the interface between the first low-refractive-index layer 610 and the second low-refractive-index layer 620 may be improved, and the light amount entering the second low-refractive-index layer 620 can be increased.

A thickness $T_{R1}$ of the first low-refractive-index layer 610 is preferably $(M-0.5)/4n_1$ to $(M+0.5)/4n_1$ times the wavelength of the incident light beam, and more preferably $M/4n_1$ times the wavelength of the incident light beam. Here, M is an odd number, $n_1$ is the refractive index of the first low-refractive-index layer 610. M is preferably "1" or "3", and more preferably, "1". When the thickness $T_{R1}$ of the first low-refractive-index layer 610 is set as described above, the first low-refractive-index layer 610 alleviates the interference between the reflecting light beams from the interface with respect to the second lens layer 200 and the reflected light beams from the interface with respect to the second low-refractive-index layer 620, so that the strength of the light beams entering the second low-refractive-index layer 620 can be increased.

In order to increase the refraction toward the optical axis as described in the first example within a range in which the thickness of the low-refractive-index film 600 is limited, the thickness $T_{R1}$ of the first low-refractive-index layer 610 and a thickness $T_{R2}$ of the second low-refractive-index layer 620 may be set as follows. First of all, a relative refractive index between the second lens layer 200 and the first low-refractive-index layer 610 and a relative refractive index between the first low-refractive-index layer 610 and the second low-refractive-index layer 620 are compared. The thickness of an exit-side medium of the layers having a larger relative refractive index (one of the first low-refractive-index layer 610 and the second low-refractive-index layer 620) is set to be larger than the thickness of an exit-side medium of the layers having a smaller relative refractive index (the other one of the first low-refractive-index layer 610 and the second low-refractive-index layer 620). Here, the relative refractive index is (the refractive index of an incident-side medium)/(the refractive index of the exit-side medium) and, in this example, the relative refractive index is larger than "1". In the description thus far, the term expressed simply as "refractive index" means the absolute refractive index. According to Snell's law, the larger the relative refractive index, the larger the outgoing angle becomes. Therefore, by increasing the thickness of the exit-side medium having the larger relative refractive index described above, the outgoing light beams can be brought closer to the optical axis. For example, when the refractive index of the second lens layer 200 is 2.00, the refractive index of the first low-refractive-index layer 610 is 1.72, and the refractive index of the second low-refractive-index layer 620 is 1.46, an expression 2.00/1.72<1.72/1.46 is established. Therefore, the thickness $T_{R2}$ of the second low-refractive-index layer 620 may be set to be larger than the thickness $T_{R1}$ of the first low-refractive-index layer 610. The thickness $T_{R2}$ of the second low-refractive-index layer 620 is preferably 60 nm to 500 nm, and more preferably 80 nm to 200 nm. The thickness $T_{R1}$ of the first low-refractive-index layer 610 is preferably 20 nm to 300 nm, and more preferably 40 nm to 150 nm.

In the third example, the low-refractive-index film 600 is a multilayer film and includes the first low-refractive-index layer 610, the second low-refractive-index layer 620, and a third low-refractive-index layer 630. The upper surface of the first low-refractive-index layer 610 forms the interface with respect to the lower surface of the second lens layer 200, and the refractive index of the first low-refractive-index layer 610 is lower than the refractive index of the second lens layer 200. The upper surface of the second low-refractive-index layer 620 forms the interface with the lower surface of the first low-refractive-index layer 610, and the refractive index of the second low-refractive-index layer 620 is lower than the refractive index of the first low-refractive-index layer 610. An upper surface of the third low-refractive-index layer 630 forms an interface with the lower surface of the second low-refractive-index layer 620, and the refractive index of the third low-refractive-index layer 630 is higher than the refractive index of the second low-refractive-index layer 620. A lower surface of the third low-refractive-index layer 630 forms an interface with the upper surface of the high-refractive-index film 330, and the refractive index of the third low-refractive-index layer 630 is lower than the refractive index of the high-refractive-index film 330. Therefore, the third low-refractive-index layer 630 has a refractive index between the refractive index of the second low-refractive-index layer 620 and the refractive index of the high-refractive-index film 330. This example may be considered to be an example in which the third low-refractive-index layer 630 is provided between the second low-refractive-index layer 620 and the high-refractive-index film 330 in the second example in a case where the refractive index of the second low-refractive-index layer 620 is lower than the refractive index of the high-refractive-index film 330 in the second example shown above. For example, when the material of the second lens layer 200 and the high-refractive-index film 330 is silicon nitride, silicon oxynitride may be used as the material of the first low-refractive-index layer 610 and the third low-refractive-index layer 630 and silicon oxide may be used as the material of the second low-refractive-index layer 620.

In the third example, both of the difference in refractive index between the second low-refractive-index layer 620 and the third low-refractive-index layer 630, and the difference in refractive index between the third low-refractive-index layer 630 and the high-refractive-index film 330 are smaller than the difference in refractive index between the second low-refractive-index layer 620 and the high-refractive-index film 330. Therefore, coefficient of transmission at the interface between the second low-refractive-index layer 620 and the third low-refractive-index layer 630, and coefficient of transmission at the interface between the third low-refractive-index layer 630 and the high-refractive-index film 330 may be improved, and the light amount entering the high-refractive-index film 330 can be increased.

In the same manner as the second example, a thickness $T_{R3}$ of the third low-refractive-index layer 630 is preferably $(M-0.5)/4n_3$ to $(M+0.5)/4n_3$ times the wavelength of the incident light beam, and more preferably $M/4n_3$ times the wavelength of the incident light beam. Here, M is an odd number, $n_3$ is a refractive index of the third low-refractive-index layer 630. The size relationship between the thickness $T_{R3}$ of the third low-refractive-index layer 630 and the thickness $T_{R2}$ of the second low-refractive-index layer 620 may be set as in the second example. In the same manner as the first low-refractive-index layer 610 in the second example, the thickness $T_{R3}$ of the third low-refractive-index layer 630 is preferably 20 nm to 300 nm, and more preferably 40 nm to 150 nm.

A refractive index $n_1$ of the first low-refractive-index layer 610 is preferably not lower than $(n_{200}+n_2)/4$, and is also preferably not exceeding $3\times(n_{200}+n_2)/4$. A refractive index $n_3$ of the third low-refractive-index layer 630 is preferably not lower than $(n_{330}+n_2)/4$, and is also preferably not exceeding $3\times(n_{200}+n_2)/4$. Here, $n_{330}$ is a refractive index of the high-refractive-index film 330.

Figure 5A:
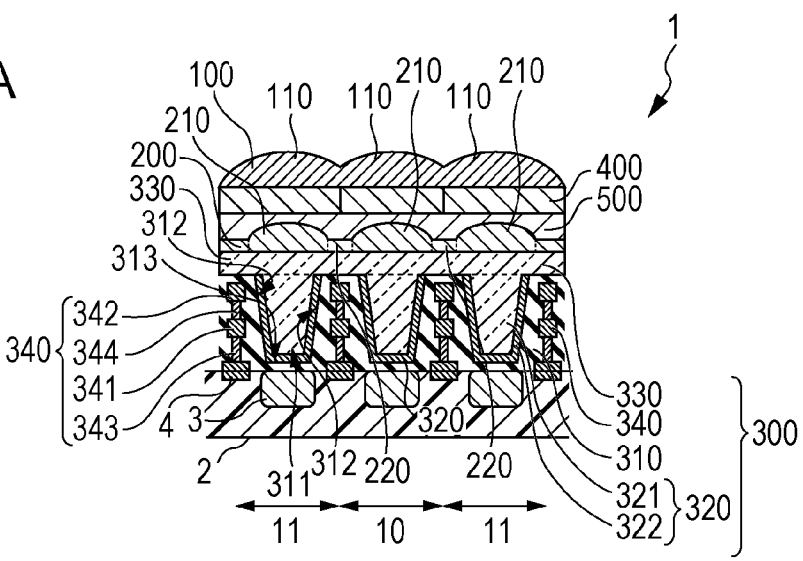
FIG. 5A is an explanatory schematic cross-sectional view of a photoelectric conversion apparatus according to a first modification.
Figure 5B:
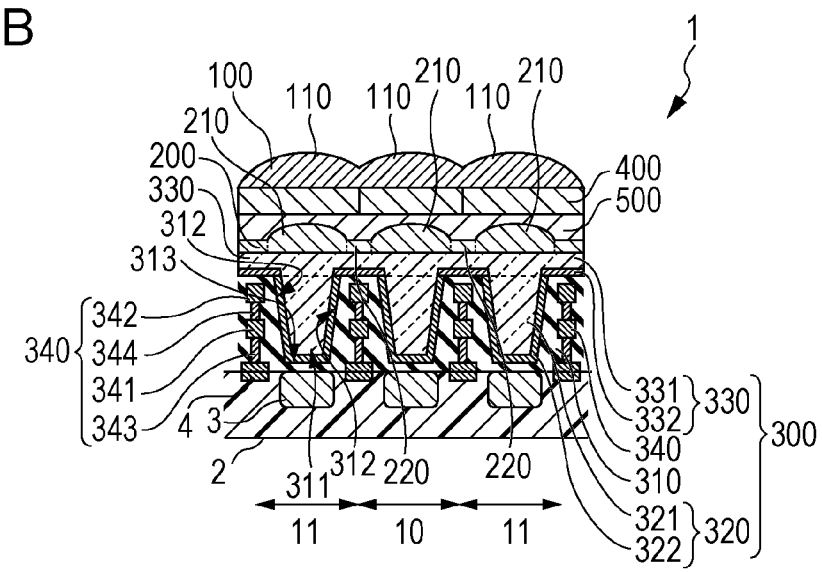
FIG. 5B is an explanatory cross-sectional view of the photoelectric conversion apparatus according to a second modification.
Figure 5C:
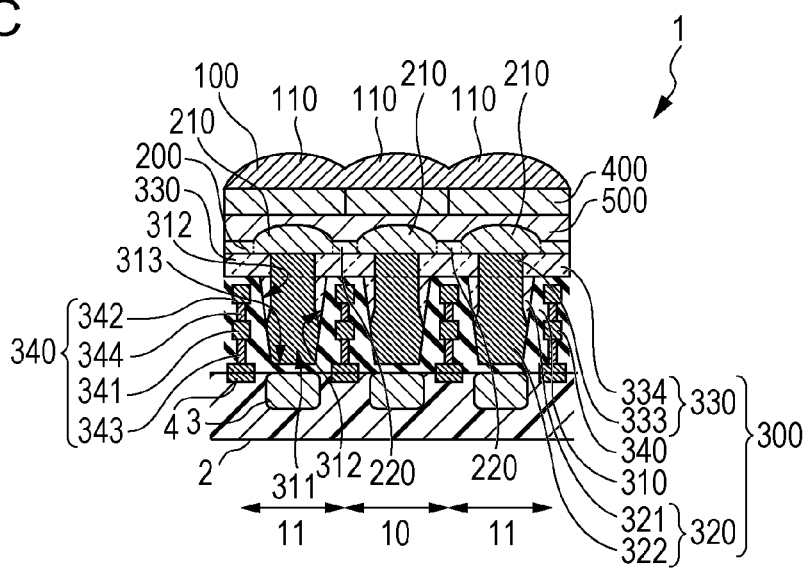
FIG. 5C is an explanatory cross-sectional view of the photoelectric conversion apparatus according to a third modification.

When the refractive index of the second lens layer 200 is higher than the refractive index of the high-refractive-index film 330, the refractive index of the first low-refractive-index layer 610 is preferably set to a refractive index higher than the refractive index of the third low-refractive-index layer 630. In other words, it is preferable to establish the relationship of $n_2<n_3<n_1<n_{330}<n_{200}$, where $n_{200}$ is the refractive index of the second lens layer 200, and the $n_{330}$ is the refractive index of the high-refractive-index film 330. In contrast, when the refractive index of the second lens layer 200 is lower than the refractive index of the high-refractive-index film 330, the refractive index of the first low-refractive-index layer 610 is preferably set to a refractive index lower than the refractive index of the third low-refractive-index layer 630. In other words, it is preferable to establish the relationship of $n_2<n_1<n_3<n_{200}<n_{330}$. In this manner, by differentiating the refractive index of the first low-refractive-index layer 610 and the third low-refractive-index layer 630 according to the refractive indices of the members above and below, the coefficient of transmission of light beams from the second lens layer 200 to the high-refractive-index film 330 can be improved, and hence the sensitivity of the photoelectric conversion apparatus 1 can be improved. A modification of the composite member 300 of the photoelectric conversion apparatus 1 will be described. FIG. 5A shows a first modification, FIG. 5B shows a second modification, and FIG. 5C shows a third modification, respectively. FIGS. 5A to 5C show examples in which the respective modifications are applied to the first embodiment shown in FIG. 1B. However, these modifications may be applied also to the second to fourth embodiments. The first to third modifications are common in that the members in the openings 311 each include a first high-refractive-index portion 321 and a second high-refractive-index portion 322. The configuration of the insulating film 310 is the same as that shown in FIG. 1A, and a plurality of the openings 311 are provided corresponding to the photoelectric conversion portions 3.

First Modification

In the first modification shown in FIG. 5A, the second high-refractive-index portions 322 are provided on the side surfaces 312 of the openings 311, and the first high-refractive-index portions 321 are provided insides the openings 311 and insides the second high-refractive-index portions 322. The second high-refractive-index portions 322 may be provided on the bottom surfaces 313 of the openings 311 as shown in FIG. 5A, and do not have to cover the bottom surfaces 313 of the openings 311. Therefore, the second high-refractive-index portions 322 are located between the first high-refractive-index portions 321 and the side surfaces 312 of the openings 311. The high-refractive-index film 330 is located on the insulating film 310, and extends on the first high-refractive-index portions 321. The high-refractive-index film 330 is formed of a transparent material which is the same as the first high-refractive-index portions 321. The refractive index of the high-refractive-index film 330 is higher than the refractive index of the insulating film 310, and the high-refractive-index film 330 is provided so as to connect the plurality of second high-refractive-index portions 322 provided in the plurality of openings 311 to one another, respectively. The material of the high-refractive-index film 330 may be the same as and different from the material of the first high-refractive-index portions 321, but preferably the same.

The refractive index of the first high-refractive-index portions 321 and the refractive index of the second high-refractive-index portions 322 are different from each other. By setting the refractive index of the first high-refractive-index portions 321 to be higher than the refractive index of the second high-refractive-index portions 322, mainly the first high-refractive-index portions 321 may be used as the light guide path. In contrast, by setting the refractive index of the first high-refractive-index portions 321 to be lower than the refractive index of the second high-refractive-index portions 322, mainly the first high-refractive-index portions 321 may be used as the light guide path. In other words, light beams directed toward the side surface 312 from among light beams having entered the first high-refractive-index portions 321 in the openings 311 by the total reflection at the interface between the first high-refractive-index portions 321 and the second high-refractive-index portions 322 can be reflected toward the photoelectric conversion portions 3 in terms of geometric optics. Also, since the light beams are guided to the side of higher refractive indices, the first high-refractive-index portions 321 can function as the light guide path in terms of wave optics.

Second Modification

In the second modification shown in FIG. 5B, the second high-refractive-index portions 322 are provided on the side surfaces 312 of the openings 311, and the first high-refractive-index portions 321 are provided insides the openings 311 and insides the second high-refractive-index portions 322. Therefore, the second high-refractive-index portions 322 are located between the first high-refractive-index portions 321 and the side surfaces 312 of the openings 311. The high-refractive-index film 330 is located on the insulating film 310, and extends on the first high-refractive-index portions 321. The high-refractive-index film 330 includes a first high-refractive-index layer 331, and a second high-refractive-index layer 332 located between the first high-refractive-index layer 331 and the insulating film 310. The refractive index of the first high-refractive-index layer 331 is higher than the refractive index of the insulating film 310, and the high-refractive-index film 330 is provided so as to connect the plurality of first high-refractive-index portions 321 provided in the plurality of openings 311 to one another respectively. The material of the first high-refractive-index layer 331 may be the same as the material of the first high-refractive-index portions 321. The refractive index of the first high-refractive-index portions 321 and the refractive index of the second high-refractive-index portions 322 are different from each other. The refractive index of the first high-refractive-index layer 331 is different from the refractive index of the second high-refractive-index layer 332. The refractive index of the second high-refractive-index layer 332 is higher than the refractive index of the insulating film 310, and the high-refractive-index film 330 is provided so as to connect the plurality of second high-refractive-index portions 322 provided in the plurality of openings 311 to one another respectively. The material of the second high-refractive-index layer 332 may be the same as the material of the second high-refractive-index portions 322.

Third Modification

In the third modification shown in FIG. 5C, the second high-refractive-index portions 322 are provided on the side surfaces 312 of the openings 311, and the first high-refractive-index portions 321 are provided insides the openings 311 and insides the second high-refractive-index portions 322. Therefore, the second high-refractive-index portions 322 are located between the first high-refractive-index portions 321 and the side surfaces 312 of the openings 311. In this modification, the second high-refractive-index portions 322 is provided only part of the incident side of the first high-refractive-index portions 321 and part of the incident side of the side surfaces 312. The refractive indices of the first high-refractive-index portions 321 and the second high-refractive-index portions 322 are higher than the refractive index of the insulating film 310. The material of the second high-refractive-index portions 322 may be the same as the material of the first high-refractive-index portions 321. The high-refractive-index film 330 includes first high-refractive-index regions 333 and second high-refractive-index regions 334. The first high-refractive-index regions 333 are formed of the same material as the first high-refractive-index portions 321, and are located on the first high-refractive-index portions 321. The refractive index of the second high-refractive-index regions 334 is higher than the refractive index of the insulating film 310, and the second high-refractive-index regions 334 extend from the top of the second high-refractive-index portions 321 to the top of the insulating film 310. The second high-refractive-index regions 334 are provided so as to connect the plurality of second high-refractive-index portions 322 provided in the plurality of openings 311 to one another respectively. The material of the second high-refractive-index regions 334 may be the same as the material of the second high-refractive-index portions 322.

In the first modification shown in FIG. 5A, the second high-refractive-index portions 322 may be replaced by a transparent material having a refractive index lower than the refractive index of the insulating film 310. In the second modification shown in FIG. 5B, either one of the first high-refractive-index portions 321 and the first high-refractive-index layer 331, and the second high-refractive-index portions 322 and the second high-refractive-index layer 332 may be replaced by a transparent material having a refractive index lower than that of the insulating film 310.

In the first modification and the second modification shown in FIGS. 5A and 5B, the second high-refractive-index portions 322 may be replaced by an opaque material having a metallic gloss. In this case, a portion formed of a metallic material corresponding to the second high-refractive-index portions 322 may be provided so as not to cover the bottom surfaces 313 of the openings 311. Light beams directed toward the side surfaces 312 from among light beams having entered the first high-refractive-index portions 321 in the openings 311 can be reflected toward the photoelectric conversion portions 3 by the metallic gloss.

In the first modification and the second modification shown in FIGS. 5A and 5B, the second high-index portion may be provided only on parts of the incident sides of the first high-refractive-index portions 321 and parts of the incident sides of the side surfaces 312 as shown in FIG. 5C.

In the first to third modifications as described above, the first high-refractive-index portions 321 and the second high-refractive-index portions 322 may be formed of different materials having different refractive indices, or may be formed of the same materials having different refractive indices. The same goes for the first high-refractive-index layer 331 and the second high-refractive-index layer 332 in the second modification, and the first high-refractive-index regions 333 and the second high-refractive-index regions 334 of the third embodiment. Even the same material can be differentiated in refractive index by varying the material density. In such a case, the refractive indices may vary continuously between the first high-refractive-index portions and the second high-refractive-index portions, between the first high-refractive-index layer and the second high-refractive-index layer, and between the first high-refractive-index film and the second high-refractive-index film. Using the same materials and differentiating the refractive indices thereof are preferable because a stress can be reduced in comparison with the case where the materials are different.

Figure 6A:
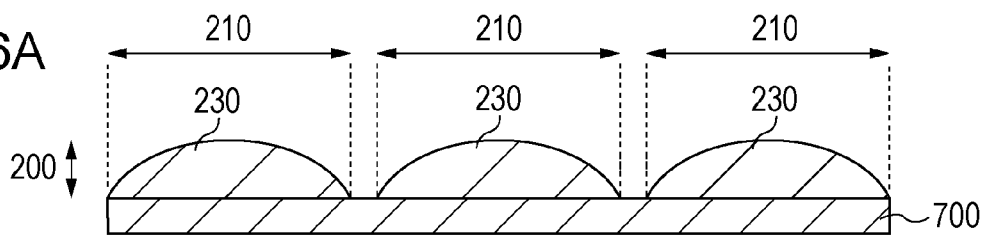
FIG. 6A is an explanatory schematic cross-sectional view of a photoelectric conversion apparatus according to a fourth modification.
Figure 6B:
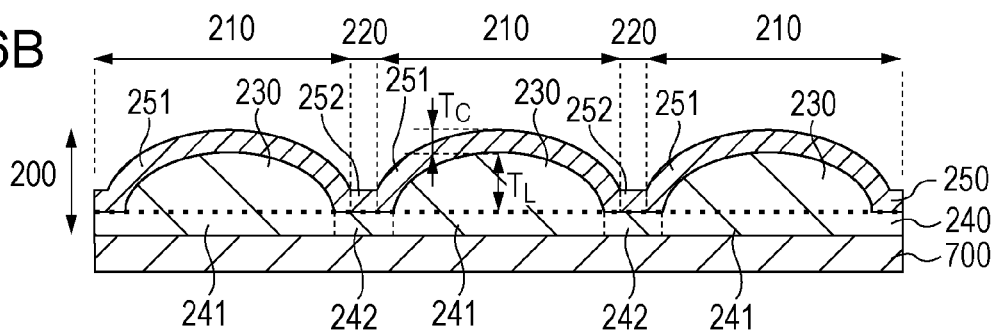
FIG. 6B is an explanatory cross-sectional view of the photoelectric conversion apparatus according to a fifth modification.
Figure 6C:
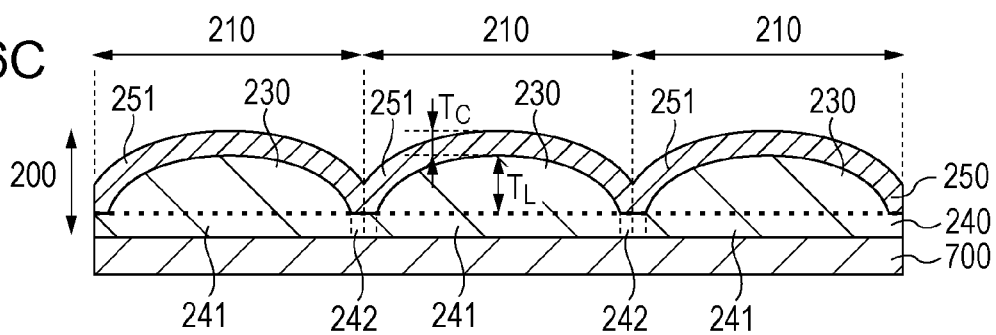
FIG. 6C is an explanatory cross-sectional view of the photoelectric conversion apparatus according to a sixth modification.
Figure 6D:
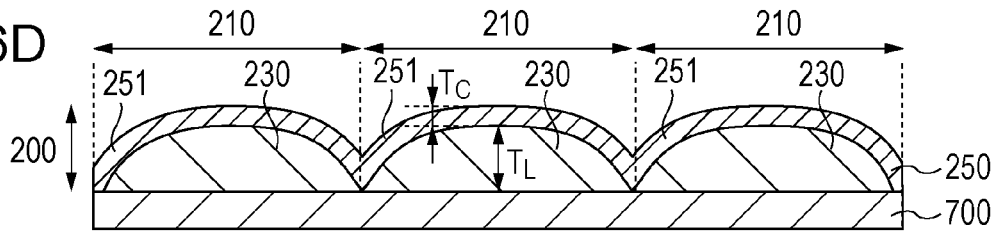
FIG. 6D is an explanatory cross-sectional view of the photoelectric conversion apparatus according to a seventh modification.
Figure 6E:
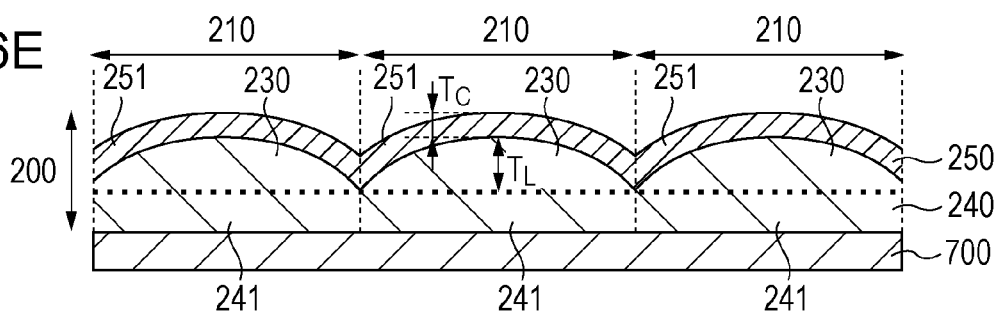
FIG. 6E is an explanatory cross-sectional view of the photoelectric conversion apparatus according to an eighth modification.
Figure 7:
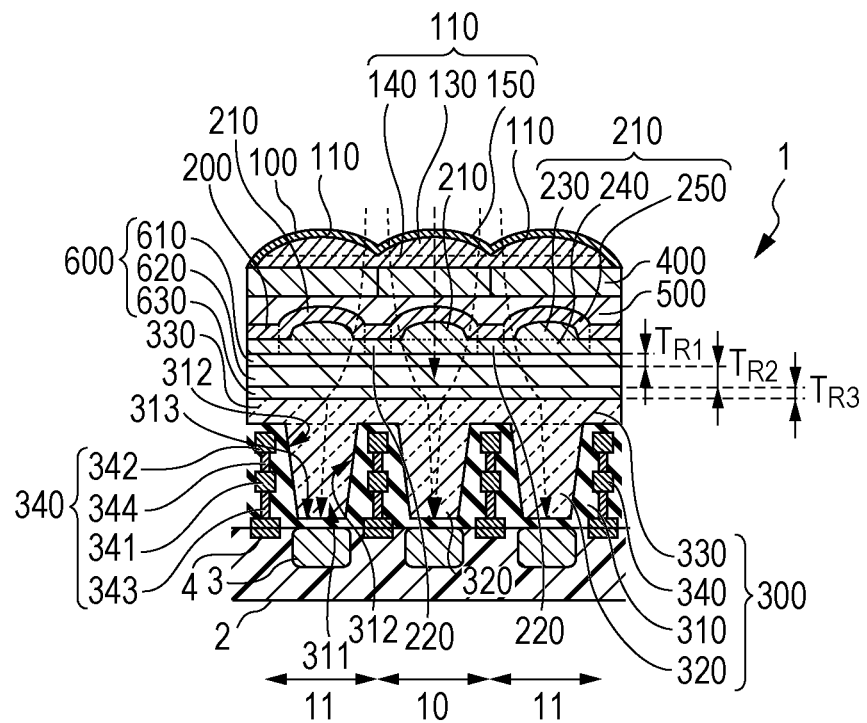
FIG. 7 is a cross-sectional view of an example of a photoelectric conversion apparatus according to a fifth embodiment.

A modification of a lens layer of the photoelectric conversion apparatus 1 will be described. FIG. 6A shows a fourth modification, FIG. 6B shows a fifth modification, FIG. 6C shows a sixth modification, FIG. 6D shows a seventh modification, and FIG. 6E shows an eighth modification respectively. FIGS. 6A to 6E show examples in which the respective modifications are applied to the second lens layer 200. However, the fourth to the eighth modifications may be applied also to the first lens layer 100 in the same manner. A member 700 in FIGS. 6A to 6E is a member which forms an interface with respect to the lower surface of the second lens layer 200, and corresponds to the high-refractive-index film 330 shown in FIG. 1A and the low-refractive-index film 600 shown in FIG. 4A.

The second lens layer 200 includes the plurality of second collective lens portions 210. However, in the fourth and fifth modifications, the second collective lens portions lying next to each other are spaced apart from each other, in the sixth to eighth modifications, the second collective lens portions lying next to each other border each other. In the fifth, sixth, and eighth embodiments, the second lens layer 200 includes a plurality of lens bodies 230 lying next to each other, a lens base member 240, and a coating 250. The lens layer only has to have at least the lens body 230, and the lens base member 240 and the coating 250 can be omitted as needed.

Fourth Modification

In the fourth modification shown in FIG. 6A, the lens base member 240 is not provided, and the second connecting portion 220 as shown in FIG. 1B does not exist between the second collective lens portions 210 lying next to each other and being apart from each other.

Fifth Modification

In the fifth modification shown in FIG. 6B, the second lens layer 200 includes the plurality of lens bodies 230 lying next to each other, the lens base member 240, and the coating 250. The surface of the lens bodies 230 has a substantially spherical surface, and the lens bodies 230 lying next to each other are spaced apart from each other.

The plurality of lens bodies 230 are located on the lens base member 240. The lens base member 240 is formed of a single material which is the same as the material of the entire lens bodies 230 or part thereof neighboring the lens base member 240. Therefore, it is difficult to observe the boundary between the lens bodies 230 and the lens base member 240 in many cases, and it is preferable to set the imaginary boundary connecting the ends of the surface (the substantially spherical surface) of the lens bodies 230. There may be a case where the material of the second lens layer 200 is the same as the material of the high-refractive-index film 330, and hence the boundary between the high-refractive-index film 330 and the lens base member 240 is not clear. In such a case, the above-described imaginary boundary may be regarded as the lower surface of the second lens layer 200 to consider that the second lens layer and the high-refractive-index film 330 border each other.

Portions of the lens base member 240 existing in regions of orthogonal projections directed from the lens bodies 230 to the semiconductor substrate 2 are referred to as lens-body-associated portions 241 and portions existing in regions other than that are referred to as lens-body-non-associated portions 242. The lens-body-non-associated portions 242 have a substantially flat surface.

The coating 250 is a film provided along the surfaces (substantially spherical surfaces) of the lens bodies 230 and the lens base member 240, and regions of parts of the surface of the 250 have a substantially spherical shape, and these regions are referred to as curved regions 251. The coating 250 is formed of a material different from the lens bodies 230. The coating 250 may be a simple layer coating, or may be a multilayer coating including two or more layers of different materials. For example, the coating 250 may be configured of two or more layers selected from a silicon oxide layer, a silicon oxynitride layer, a silicon nitride layer, and a fluorine contained resin layer. The regions of the surface of the coating 250 other then the curved regions 251 are substantially flat and these regions are referred to as flat regions 252. The entire parts of the lens bodies 230, part of the lens base member 240, and parts of the coating 250 located in regions of orthogonal projections for the curved regions 251 toward the semiconductor substrate 2 constitute the plurality of second collective lens portions 210. The part of the lens base member 240 here means specifically the entire parts of the lens-body-associated portions 241 and the parts of the lens-body-non-associated portions 242. In contrast, the part of the lens base member 240 (specifically, parts of the remaining portions of the lens-body-non-associated portions 242), and part of the coating 250 located in regions of orthogonal projections directed from the flat regions 252 toward the semiconductor substrate 2 constitute the second connecting portion 220. In this manner, a configuration in which the second collective lens portions 210 lying next to each other are spaced apart from each other may be obtained.

The refractive index of the coating 250 is desirably set to be lower than the refractive index of the lens bodies 230. By setting the refractive index of the coating 250 as described above, the coating 250 increases the coefficient of transmission of the incident light beams upon the surfaces of the lens bodies 230, namely, has a function of inhibiting reflection in terms of geometric optics.

A thickness $T_C$ of the coating 250 is smaller than the thickness $T_L$ of the lens bodies 230. The thickness $T_C$ is preferably ½ the thickness $T_L$ or smaller. The thickness $T_C$ of the coating 250 is preferably not more than 200 nm. The thickness $T_C$ of the coating 250 is preferably $(M-0.5)/4n_C$ to $(M+0.5)/4n_C$ times the wavelength of the incident light beam, and more preferably $M/4n_C$ times the wavelength of the incident light beam. Here, M is an odd number, $n_C$ is a refractive index of the coating 250. M is preferably "1" or "3", and more preferably, "1". By setting the thickness of the coating 250 as described above, the coating 250 has a function of weakening interference between the reflecting light from the surface of the lens bodies 230 and the reflecting light from the surface of the coating 250, namely, of inhibiting reflection in terms of wave optics. As described above, the loss of the light beams is reduced by the lens portions having a reflection inhibiting structure so that the photoelectric conversion apparatus having a high sensitivity is obtained. For example, when the lens bodies 230 are formed of silicon nitride having a refractive index of 2.00, the coating 250 is preferably formed of silicon oxynitride having a refractive index of 1.73. The thickness of the coating 250 may be set to, for example, 80 nm. Also, for example, when the lens bodies 230 are formed of a resin having a refractive index of 1.60, the coating 250 is preferably formed of silicon oxynitride having a refractive index of 1.46. The thickness of the coating 250 may be set to, for example, 94 nm. In the case of the multilayer coating, the coating 250 may be formed of a plurality of layers having a refractive index lower than the refractive index of the lens bodies 230. However, the coating 250 may constitute a layer having a refractive index higher than the lens bodies 230 and a layer having a low refractive index than the lens bodies 230 depending on the conditions which may weaken the interference on the basis of the thickness and the wavelength.

Sixth Modification

In the sixth modification shown in FIG. 6C, the lens bodies 230 lying next to each other are spaced apart from each other, and the lens base member 240 includes the lens-body-non-associated portions 242 having a substantially flat surface. In contrast, the curved regions 251 of the coating 250 border each other. Therefore, the entire parts of the lens bodies 230, the entire part of the lens base member 240 (more specifically, the entire parts of the lens-body-associated portions 241 and the entire parts of the lens-body-non-associated portions 242), and the entire part of the coating 250 constitute the plurality of the second collective lens portions 210. In this manner, by providing the coating 250, a configuration in which the second collective lens portions 210 lying next to each other border each other even though the lens bodies 230 are spaced apart from each other is achieved.

Seventh Modification

In the seventh modification shown in FIG. 6D, the lens bodies 230 lying next to each other are spaced apart from each other. In this example, the lens base member 240 is eliminated. In contrast, the curved regions 251 of the coating 250 border each other. Therefore, the entire parts of the lens bodies 230 and the entire part of the coating 250 constitute the plurality of second collective lens portions 210. In this manner, by providing the coating 250, a configuration in which the second collective lens portions 210 lying next to each other border each other even though the lens bodies 230 are spaced apart from each other is achieved.

Eighth Modification

In the eighth modification shown in FIG. 6E, the lens bodies 230 lying next to each other border each other, and the curved regions 251 lying next to each other also border each other. The lens base member 240 does not have the substantially flat lens-body-non-associated portions 242. Therefore, the entire parts of the lens bodies 230, the entire part of the lens base member 240, and the entire part of the coating 250 constitute the plurality of second collective lens portions 210. Consequently, the second collective lens portions 210 lying next to each other border each other. In this embodiment, since the lens bodies 230 border each other, light beams entering portions in the vicinity of the boundaries of the second collective lens portions 210 lying next to each other (in the vicinity of the boundaries between the curved regions 251) can collect further reliably by the separate lens bodies 230.

Fifth Embodiment

As described above, the fourth to eighth modifications may be applied also to the first lens layer 100 in the same manner. As a fifth embodiment, an example in which the eighth modification is applied to the first lens layer 100 and an example in which the fifth modification is applied to the second lens layer 200 in the third example of the fourth embodiment described in conjunction with FIG. 4C will be shown in FIG. 7.

The first collective lens portions 110 of the first lens layer 100 include a first base member 140, a first lens body 130, and a first coating 150. In this example, the first base member 140 and the first lens body 130 are formed of resin, and the first coating 150 is formed f silicon oxide. The second collective lens portions 210 of the second lens layer 200 include the second base member 240, the second lens body 230, and the second coating 250. In this example, the second base member 240 and the second lens body 230 are formed of silicon nitride, and the second coating 250 is formed of silicon oxynitride.

As described in conjunction with FIG. 8, there may be a case where the image quality is deteriorated when light beams enter the connecting portions of the lens layer. Therefore, if a coating which inhibits reflection of light beams is provided on the first connecting portions between the first collective lens portions 110, the deterioration of the image quality may become remarkable. In contrast, since the first collective lens portions 110 lying next to each other border each other, as described above, the connecting portions do not exist between the first collective lens portion 110 of the photodetector of interest 10 and the primary neighboring photodetectors 11. Therefore, there is no light beams entering the connecting portions, the deterioration of the image quality is inhibited. The same goes for the photodetector of interest 10 and the secondary neighboring photodetectors 12.

If there is an interface having a high reflectivity between the first lens layer 100 and the semiconductor substrate 2, interference of the reflecting light beams may readily occurs at each of the interfaces, and color hue irregularity may be remarkable. In particular, reflection on the surface (upper surface) of the first lens layer 100, reflection on the surface (upper surface) of the second lens layer 200, and reflection on the surface of the semiconductor substrate 2 may become significant causes of the color hue irregularity caused by the interference between the light beams. In this example, since the reflection at the first lens layer 100 can be inhibited by the first coating 150, the color hue irregularity may be improved. Furthermore, in this example, the reflection at the surface of the second lens layer 200 can be inhibited by the second coating. The color hue irregularity may become remarkable when intervals of the reflecting surfaces are small. However, by inhibiting the reflection by both of the surface of the first lens layer 100 and the surface of the second lens layer 200, the color hue irregularity can further be improved. The second lens layer 200 includes the second connecting portion 220, and hence reflection at the second connecting portion 220 may be inhibited by the second coating 250. However, since the first collective lens portions 110 of the first lens layer 100 border each other, the incident light beams into the second connecting portion 220 can be reduced as much as possible.

By setting the curvature of the first collective lens portions 110 to 0.49 (1/µm) or larger, the color hue irregularity can be inhibited. The color hue irregularity is mainly caused by the interference of the light beams generated in the direction of the normal line of the semiconductor substrate 2. By reducing the radius of curvature of the first collective lens portions 110, the direction of travel of the reflected light beams from the surface (upper surface) of the first collective lens portions 110 can be shifted from the direction of travel of the reflected light beams from other surfaces. Consequently, the reflected light beams from the surface (upper surface) of the first collective lens portions 110 is prevented from interfering with the reflected light beams from other surfaces.

In addition, in this embodiment, the refractive index of the second lens layer 200 (specifically, the refractive index of the second base member 240 of the second lens layer 200) is higher than the refractive index of the high-refractive-index film 330. For example, the second lens layer 200 may be formed of silicon nitride having a refractive index of 2.00, and the high-refractive-index film 330 may be formed of silicon nitride having a refractive index of 1.84. Therefore, by setting the refractive index of the first low-refractive-index layer 610 to a refractive index higher than the refractive index of the third low-refractive-index layer 630 as described in the third modification, the reflected light beams at the lower surface of the second lens layer 200 and the upper surface of the high-refractive-index film 330 can be reduced. For example, the first low-refractive-index layer 610 may be formed of silicon oxynitride having a refractive index of 1.73, the second low-refractive-index layer 620 may be formed of silicon oxide having a refractive index of 1.46, and the third low-refractive-index layer 630 may be formed of a material having a refractive index of 1.65.

The photoelectric conversion apparatus 1 described thus far can be used, for example, as an imaging sensor, a distance-measuring sensor, a photometric sensor. The photoelectric conversion apparatus 1 may have a plurality of functions from among the imaging sensor, the distance-measuring sensor, and the photometric sensor.

Figure 9:
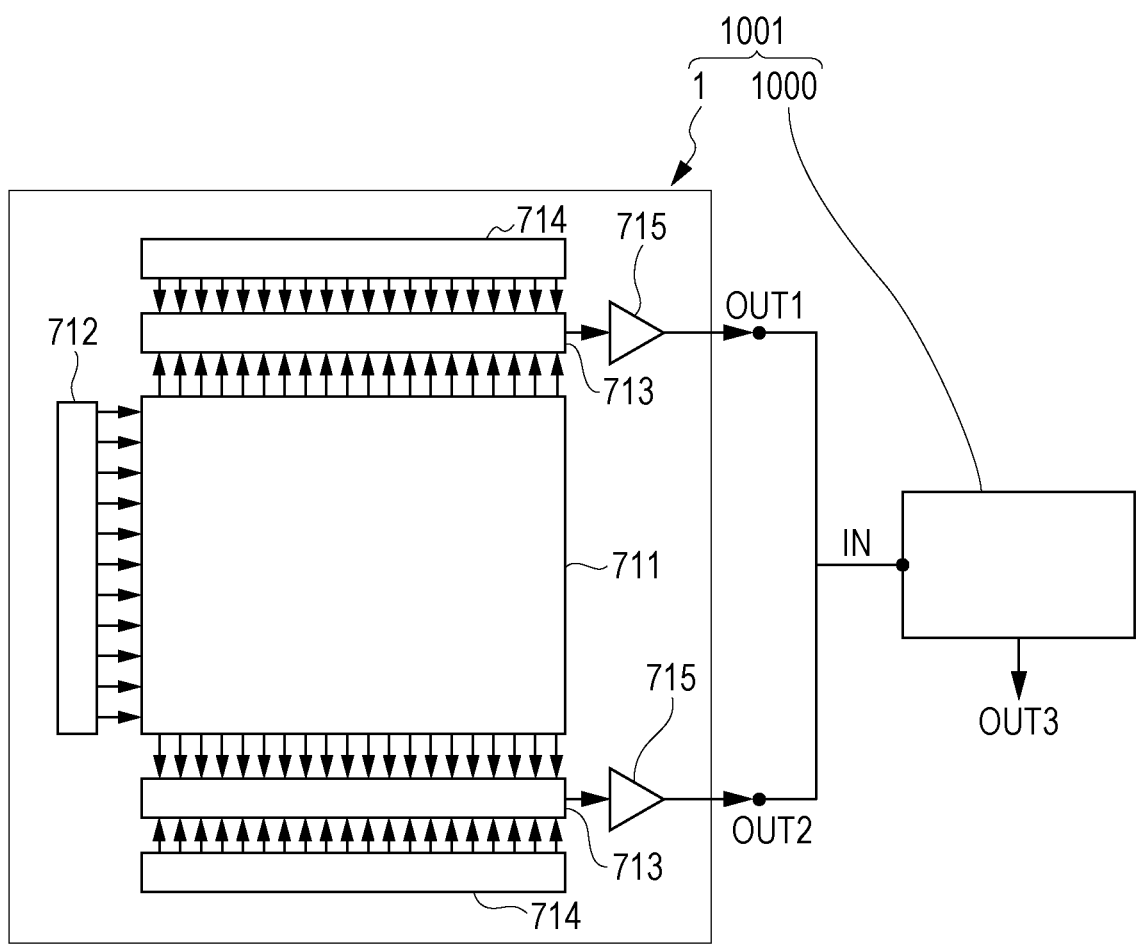
FIG. 9 is a schematic drawing for explaining an example of an image sensing system.

It is also possible to construct an image sensing system having the photoelectric conversion apparatus 1 and a signal processing apparatus configured to receive an input of an electric signal output from the photoelectric conversion apparatus 1 and process the electric signal. FIG. 9 is a drawing showing an example of an image sensing system 1001. The electric signal is output from OUT1, OUT2 of the photoelectric conversion apparatus 1. Here, an example in which two output routes, namely the OUT1 and OUT2 are provided has been described, the number of the output route may be one or three or more. The electric signal is input to IN of a signal processing apparatus 1000. The electric signal may be either a current signal or a voltage signal, and maybe an analogue signal and a digital signal.

When using the photoelectric conversion apparatus 1 as the image sensor, the signal processing apparatus 1000 is configured to output an image signal from OUT 3 when being supplied with an input of an electric signal into IN. When the photoelectric conversion apparatus 1 is used as the distance-measuring sensor for detecting a focal point, the signal processing apparatus 1000 is configured to output a drive signal for driving a lens provided in front of the photoelectric conversion apparatus 1 from OUT3 when being supplied with an electric signal into IN. When the photoelectric conversion apparatus 1 is used as the photometric sensor, the signal processing apparatus 1000 is configured to output a control signal which controls a shutter and adjusts the exposure time from OUT 3 when being supplied with an electric signal to IN. The shutter described above may be either a mechanical shutter or an electronic shutter. In the case of the electronic shutter, the photoelectric conversion apparatus 1 is substantially controlled. The photoelectric conversion apparatus 1 in the disclosure may be used as the image sensor, and satisfactory images may be obtained.

An example of the photoelectric conversion apparatus 1 in the image sensing system 1001 shown in FIG. 9 will be described. In this example, a pixel amplifying type photoelectric conversion apparatus as the photoelectric conversion apparatus 1 is used as the image sensor. In FIG. 9, the photoelectric conversion apparatus 1 includes a pixel portion 711, a vertical scanning circuit 712, two reading circuits 713, two horizontal scanning circuits 714, and two output amplifiers 715. Regions other than the pixel portion 711 are also referred to as peripheral circuit portions.

The pixel portion 711 includes a plurality of pixel cells arranged two-dimensionally. The respective pixel cells include a plurality of pixels. Each of the pixels includes the reading circuits 713, for example, a column amplifier, a CDS circuit, an adding circuit and the like, and performs amplification, addition, and the like for the signal read from the pixels of a row selected by a vertical scanning circuit 712 via vertical signal lines. The column amplifier, the CDS circuit, the adding circuit, and the like are arranged for a pixel column, or each of a plurality of pixel columns for example. The horizontal scanning circuits 714 generate a signal for reading signals from the reading circuits 713 in sequence. The output amplifiers 715 amplify and output a signal of a column selected by the horizontal scanning circuits 714.

The configuration described above is only an example of the photoelectric conversion apparatus 1, and the invention is not limited thereto. The reading circuits 713, the horizontal scanning circuits 714, and the output amplifiers 715, constituting two systems of output routes (OUT1, OUT2), are arranged one each on an upper side and the lower side across the pixel portion 711.

Examples of the representative image sensing system 1001 include cameras such as still cameras and video cameras. The image sensing system 1001 may include travelling means (not shown) which makes the photoelectric conversion apparatus 1 movable. Examples of the travelling means include wheels driven by a driving means such as an electric motor, a reciprocal engine, and a rotary engine. Examples of the traveling means include propulsion devices such as a propeller, a turbine engine, a rocket engine. The image sensing system provided with the travelling means as described above may be realized by mounting the photoelectric conversion apparatus 1 and the signal processing apparatus 1000 on vehicles, railway vehicles, ships, airplanes, earth satellites, and the like.

As described above, according to the invention, adequate light beams can be caused to enter the photoelectric conversion portion with high degree of accuracy.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-026345 filed Feb. 9, 2011 and No. 2011-223303 filed Oct. 7, 2011, which are hereby incorporated by reference herein in their entirety.

What is claimed is:

1. A photoelectric conversion apparatus having a plurality of photodetectors, each of the plurality of photodetectors comprising:
    a photoelectric conversion portion;
    a first lens portion;
    a second lens portion arranged between the first lens portion and the photoelectric conversion portion; and
    a light guide portion arranged between the second lens portion and the photoelectric conversion portion, the light guide portions being located in an opening of an insulating film;
    wherein the plurality of photodetectors includes a first photodetector, and a second photodetector being next to the first photodetector,
    wherein a first lens portion of the first photodetector borders a first lens portion of the second photodetector,
    wherein a second lens portion of the first photodetector is spaced apart from a second lens portion of the second photodetector,
    wherein a width of a light guide portion of the first photodetector is smaller than the width of the second lens portion of the first photodetector in a direction where the first photodetector and the second photodetector are arranged, and
    wherein a low-refractive-index layer having a refractive index lower than a material of the second lens portion is arranged between the second lens portion and the light guide portion.

2. The photoelectric conversion apparatus according to claim 1,
    wherein a region having a refractive index higher than the insulating film is located between the low-refractive-index layer and the insulating film.

3. The photoelectric conversion apparatus according to claim 1, wherein a region having a refractive index higher than the low-refractive-index layer is located between the low-refractive-index layer and the light guide portion.

4. The photoelectric conversion apparatus according to claim 1, wherein the low refractive-index layer is spaced apart from the insulating film.

5. The photoelectric conversion apparatus according to claim 1, wherein
    a layer having a refractive index between the refractive index of the second lens portion and the refractive index of the low-refractive-index layer, is arranged between the second lens portion and the low-refractive-index layer.

6. The photoelectric conversion apparatus according to claim 1, wherein
a layer having a refractive index between the refractive index the light guide portion and the refractive index of the low-refractive-index layer, is arranged between the light guide portion and the low-refractive-index layer.

7. The photoelectric conversion apparatus according to claim 1, wherein
a first layer having a refractive index less than the refractive index of the second lens portion is arranged between the low-refractive-index layer and the second lens portion,
a second layer having a refractive index less than the refractive index of the light guide portion is arranged between the low-refractive-index layer and the light guide portion, the
refractive index of the second lens portion being higher than the refractive index of the light guide portion, and
the refractive index of the first layer is greater than the refractive index of the second layer.

8. The photoelectric conversion apparatus according to claim 1, wherein the first lens portion includes a first lens body and a first coating provided along a curved surface of the first lens body and having a refractive index less than a refractive index of the first lens body.

9. The photoelectric conversion apparatus according to claim 1, wherein the second lens portion includes a second lens body and a second coating provided along a curved surface of the second lens body and having a refractive index less than a refractive index of the second lens body.

10. The photoelectric conversion apparatus according to claim 1, wherein at least one of conditions (a) and (b) is satisfied;
(a) the first lens portion includes a first lens body formed of resin and a first coating provided along the curved surface of the first lens body and including a silicon oxide, and
(b) the second lens portion includes a second lens body formed of silicon nitride and a second coating provided along the curved surface of the second lens body and including a silicon oxynitride.

11. The photoelectric conversion apparatus according to claim 1, wherein a wiring formed of copper is provided in the interior of the insulating film.

12. The photoelectric conversion apparatus according to claim 1, wherein the low-refractive-index layer is a silicon oxide layer.

13. The photoelectric conversion apparatus according to claim 1, wherein each of the plurality of photodetectors comprises a wavelength selecting member arranged between the first lens portion and the second lens portion.

14. The photoelectric conversion apparatus according to claim 1, wherein the second lens portion and the light guide portion are formed of silicon nitride.

15. The photoelectric conversion apparatus according to claim 1, wherein
the light guide portion includes a first portion and a second portion located between the insulating film and the first portion, and
a refractive index of the first portion is different from a refractive index of the second portion.

16. The photoelectric conversion apparatus according to claim 1, further comprising a connecting portion disposed between the second lens portion of the first photodetector and the second lens portion of the second photodetector, the connecting portion being formed of a material same as a material of the second lens portion of the first photodetector.

17. A photoelectric conversion apparatus having a plurality of photodetectors, each of the plurality of photodetectors comprising:
a photoelectric conversion portion;
a first lens portion;
a second lens portion arranged between the first lens portion and the photoelectric conversion portion; and
a light guide portion arranged between the second lens portion and the photoelectric conversion portion, the light guide portions being located in an opening of an insulating film;
wherein a first pitch of photodetectors being next to each other in a first direction is different from a second pitch of photodetectors being next to each other in a second direction oblique to the first direction,
wherein a width of a first lens portion of one photodetector among the plurality of photodetectors in the first direction is equal to the first pitch,
wherein a width of a second lens portion of the one photodetector in the first direction is smaller than the first pitch of photodetectors,
wherein a width of a light guide portion of the one photodetector in the first direction is smaller than the width of the second lens portion of the one photodetector in the first direction, and
wherein a low-refractive-index layer having a refractive index lower than a material of the second lens portion is arranged between the second lens portion and the light guide portion.

18. The photoelectric conversion apparatus according to claim 17, wherein
the first pitch is smaller than the second pitch,
a width of the first lens portion of one photodetector in the second direction is equal to the second pitch,
a width of the second lens portion of the one photodetector in the second direction is smaller than the second pitch of photodetectors, and
a width of the light guide portion of the one photodetector in the second direction is smaller than the width of the second lens portion of the one photodetector in the second direction.

19. The photoelectric conversion apparatus according to claim 17, wherein a curvature of the first lens portion of the one photodetector is at least 0.49 (1/μm).

20. An image sensing system comprising:
a photoelectric conversion apparatus, and
a signal processing apparatus configured to be supplied with an input of an electric signal output from the photoelectric conversion apparatus and process the electric signal,
wherein the photoelectric conversion apparatus having a plurality of photodetectors, each of the plurality of photodetectors comprising:
a photoelectric conversion portion;
a first lens portion;
a second lens portion arranged between the first lens portion and the photoelectric conversion portion; and
a light guide portion arranged between the second lens portion and the photoelectric conversion portion, the light guide portions being located in an opening of an insulating film;
wherein the plurality of photodetectors includes a first photodetector, and a second photodetector being next to the first photodetector, wherein a first lens portion of the first photodetector borders a first lens portion of the second photodetector, wherein a second lens portion of the first photodetector is spaced apart from a second lens portion of the second photodetector, wherein a width of a light guide portion of the first photodetector is smaller than the width of the second lens portion of the first photodetector in a direction where the first photodetector and the second photodetector are arranged, and wherein a low-refractive-index layer having a refractive index lower than a material of the second lens portion is arranged between the second lens portion and the light guide portion.

21. A photoelectric conversion apparatus having a plurality of photo detectors, each of the plurality of photodetectors comprising:

a photoelectric conversion portion;

a first lens portion;

a second lens portion arranged between the first lens portion and the photoelectric conversion portion; and a light guide portion arranged between the second lens portion and the photoelectric conversion portion, the light guide portions being located in an opening of an insulating film;

wherein a first pitch of photodetectors being next to each other in a first direction is different from a second pitch of photodetectors being next to each other in a second direction oblique to the first direction, wherein a width of a first lens portion of one photodetector among the plurality of photodetectors in the first direction is equal to the first pitch, wherein a width of a second lens portion of the one photodetector in the first direction is smaller than the first pitch, wherein a width of a light guide portion of the one photodetector in the first direction is smaller than the width of the second lens portion of the one photodetector in the first direction, and wherein a silicon oxide layer is arranged between the second lens portion and the light guide portion.

22. The photoelectric conversion apparatus according to claim 21, wherein the first pitch is smaller than the second pitch.

23. The photoelectric conversion apparatus according to claim 22, wherein a width of a first lens portion of one photodetector among the plurality of photodetectors in the second direction is equal to the second pitch, wherein a width of a second lens portion of the one photodetector in the second direction is smaller than the second pitch of photodetectors, and wherein a width of a light guide portion of the one photodetector in the second direction is smaller than a width of the second lens portion of the one photodetector in the second direction.

24. The photoelectric conversion apparatus according to claim 21, wherein the second lens portion is formed of silicon nitride.

25. The photoelectric conversion apparatus according to claim 21, wherein the light guide portion is formed of silicon nitride.

26. A photoelectric conversion apparatus having a plurality of photo detectors, each of the plurality of photodetectors comprising:

a photoelectric conversion portion;

a lens portion; and a light guide portion arranged between the lens portion and the photoelectric conversion portion, the light guide portions being located in an opening of an insulating film, wherein a first pitch of photodetectors being next to each other in a first direction is smaller than a second pitch of photodetectors being next to each other in a second direction oblique to the first direction, wherein a width of the lens portion of one photodetector among the plurality of photodetectors in the first direction is equal to the first pitch, and a width of the lens portion of the one photodetector in the second direction is equal to the second pitch, and wherein a silicon nitride layer arranged between the lens portion and the light guide portion, and a silicon oxide layer is arranged between the silicon nitride layer and the light guide portion.

27. The photoelectric conversion apparatus according to claim 26, wherein a silicon oxynitride layer is arranged between the silicon nitride layer and the silicon oxide layer.

28. The photoelectric conversion apparatus according to claim 26, wherein a silicon oxynitride layer is arranged between the silicon nitride layer and the lens portion.

29. The photoelectric conversion apparatus according to claim 26, wherein a color filter is arranged between the silicon nitride layer and the lens portion.

30. The photoelectric conversion apparatus according to claim 26, wherein the light guide portion comprises an organic material.

* * * * *